United States Patent
Miyazawa

(10) Patent No.: US 6,858,991 B2
(45) Date of Patent: Feb. 22, 2005

(54) UNIT CIRCUIT, ELECTRONIC CIRCUIT, ELECTRONIC APPARATUS, ELECTRO-OPTIC APPARATUS, DRIVING METHOD, AND ELECTRONIC EQUIPMENT

(75) Inventor: Takashi Miyazawa, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 170 days.

(21) Appl. No.: 10/236,975

(22) Filed: Sep. 9, 2002

(65) Prior Publication Data

US 2003/0062844 A1 Apr. 3, 2003

(30) Foreign Application Priority Data

| Sep. 10, 2001 | (JP) | 2001-274140 |
| May 31, 2002 | (JP) | 2002-160245 |
| Jul. 31, 2002 | (JP) | 2002-223165 |

(51) Int. Cl.$^7$ .............................. G09G 3/10; G09G 5/00
(52) U.S. Cl. ..................................... 315/169.3; 345/204
(58) Field of Search ......................... 315/169.1, 169.2, 315/169.3, 169.4; 345/30, 33, 45, 76, 204, 44, 46, 82, 83, 205, 206

(56) References Cited

U.S. PATENT DOCUMENTS

| 5,903,246 | A |  | 5/1999 | Dingwall | 345/82 |
| 5,952,789 | A |  | 9/1999 | Stewart et al. | 345/82 |
| 6,091,203 | A |  | 7/2000 | Kawashima et al. | 315/169.3 |
| 6,229,506 | B1 | * | 5/2001 | Dawson et al. | 345/82 |
| 6,295,046 | B1 | * | 9/2001 | Hebiguchi | 345/100 |
| 6,300,928 | B1 | * | 10/2001 | Kim | 345/92 |
| 6,348,906 | B1 | * | 2/2002 | Dawson et al. | 345/82 |
| 6,362,798 | B1 | * | 3/2002 | Kimura et al. | 345/55 |
| 6,392,617 | B1 | * | 5/2002 | Gleason | 345/82 |
| 6,433,488 | B1 | * | 8/2002 | Bu | 315/169.3 |
| 6,535,185 | B2 | * | 3/2003 | Kim et al. | 345/76 |

FOREIGN PATENT DOCUMENTS

| EP | 1 102 234 A2 | 5/2001 |
| JP | A 11-282419 | 10/1999 |
| JP | A 2001-147659 | 5/2001 |
| WO | WO 99/65012 | 12/1999 |

OTHER PUBLICATIONS

Johnson et al., "Active Matrix PolyLED Displays", IDW, pp. 235–238, 2000.

Bae et al., "A Novel Pixel Design for an Active Matrix Organic Light Emitting Diode Display", ISSN, pp. 358–361, 2000.

Yumoto et al., "Pixel–Driving Methods for Large–Sized Poly–Si AM–OLED Displays", Asia Display, IDW, pp. 1395–1398, 2000.

* cited by examiner

Primary Examiner—Don Wong
Assistant Examiner—Minh Dieu A
(74) Attorney, Agent, or Firm—Oliff & Berridge, PLC

(57) ABSTRACT

The invention compensates for variations of a driving transistor Tr1. The invention provides a pixel circuit including a current-type driven element L, a driving transistor Tr1 to control the amount of electrical current to be supplied to the driven element, a capacitor element C connected to the gate of the driving transistor, a switching transistor Tr3 connected to the gate of the driving transistor, a switching transistor Tr1, a scanning line S connected to the gate of the switching transistor Tr3, a data line D connected to the source or the drain of the switching transistor Tr3, and a power-supply line V connected to a signal line via the switching transistor Tr3. A diode-connected compensating transistor Tr4 is disposed between the power-supply line V and the switching transistor Tr3.

19 Claims, 13 Drawing Sheets

[FIG. 1]
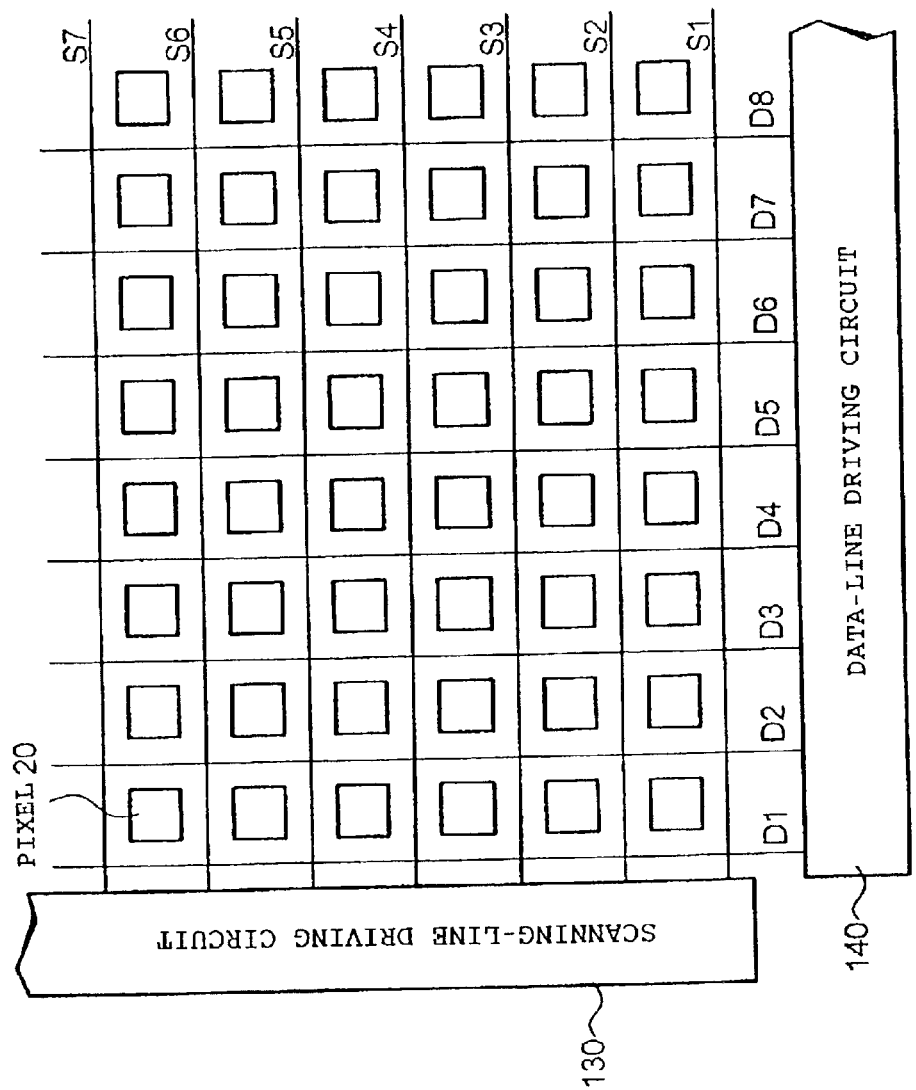

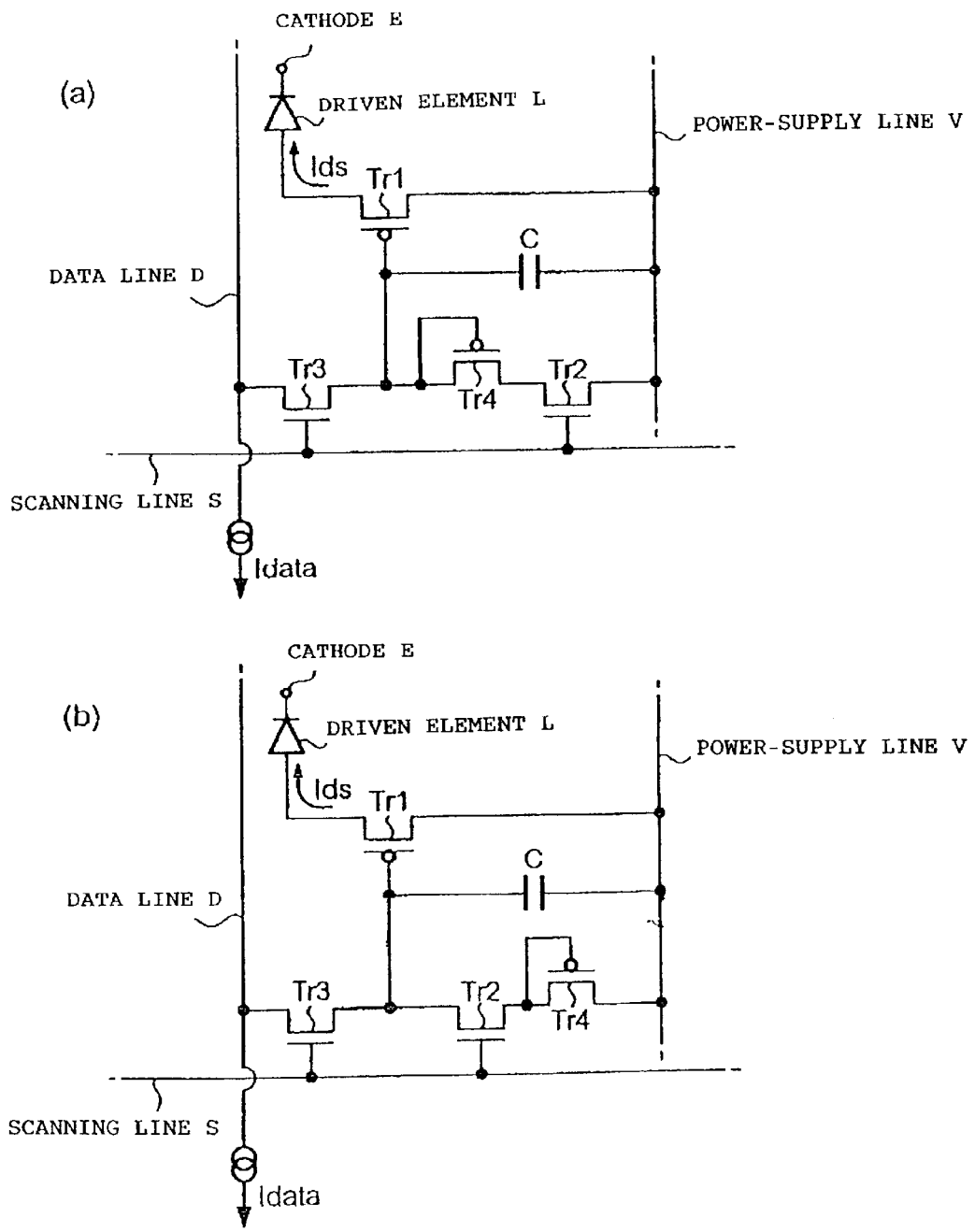
[FIG. 2]

[FIG. 2]
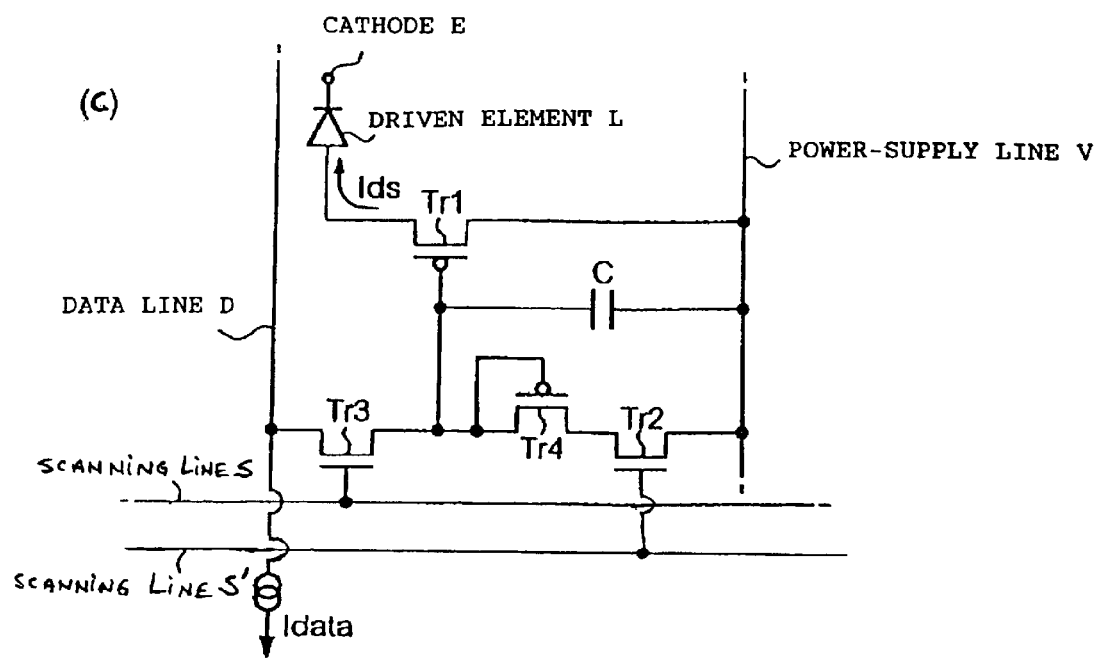

[FIG. 3]
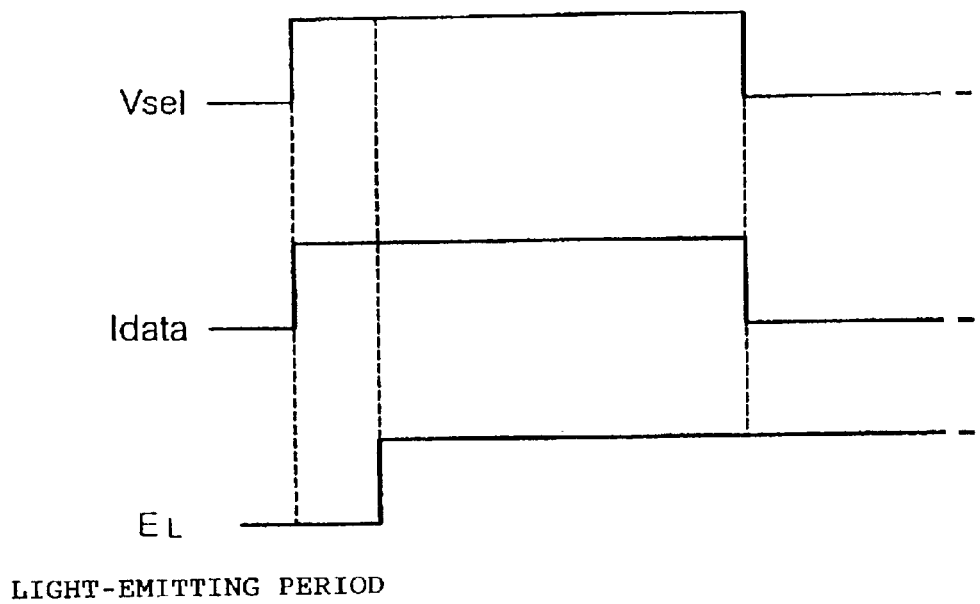
LIGHT-EMITTING PERIOD

[FIG. 4]
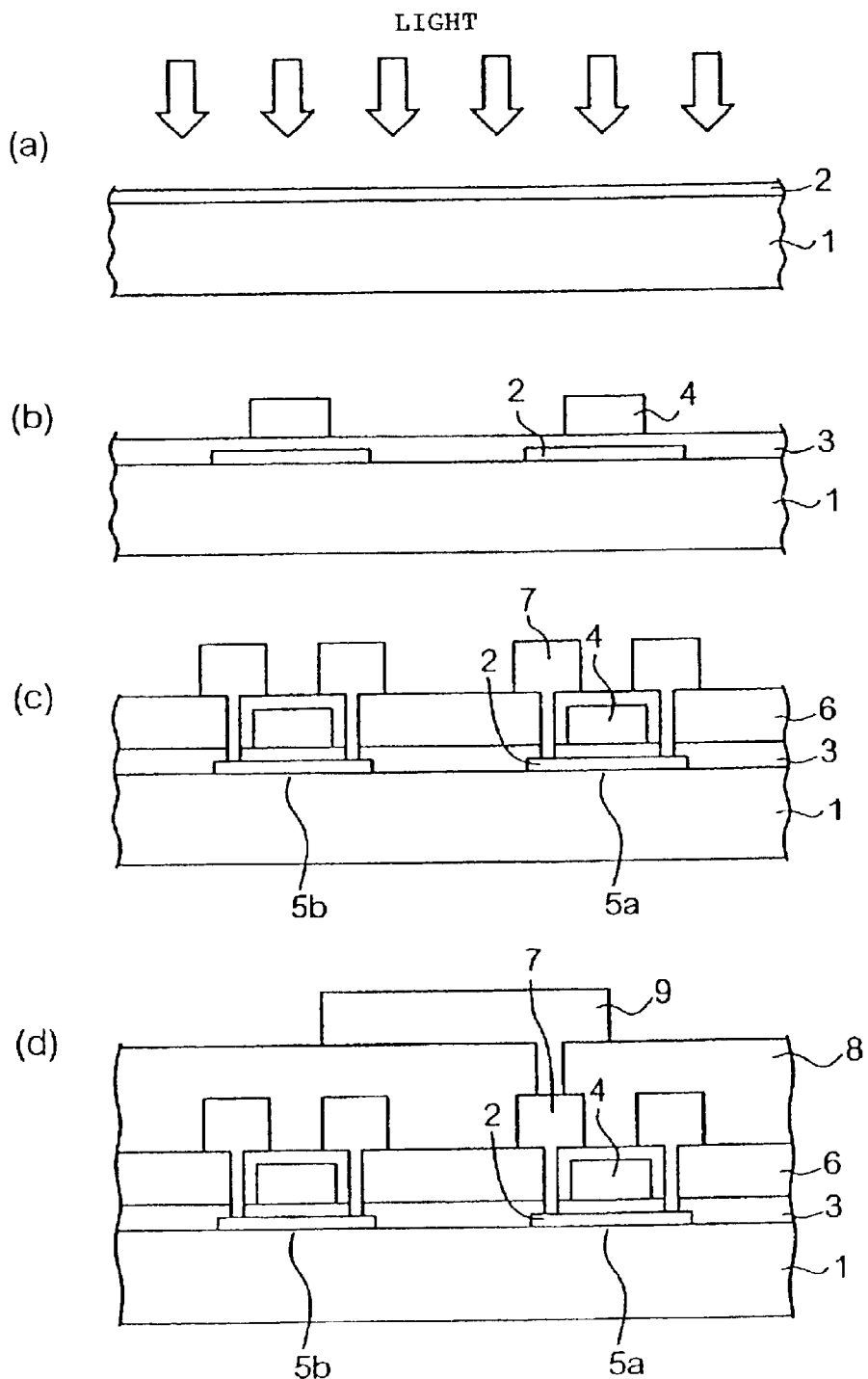

[FIG. 5]
(a) 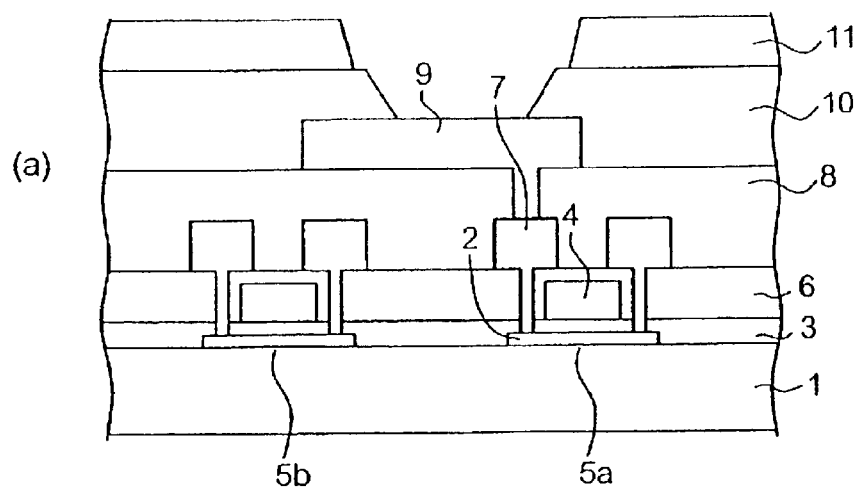
(b) 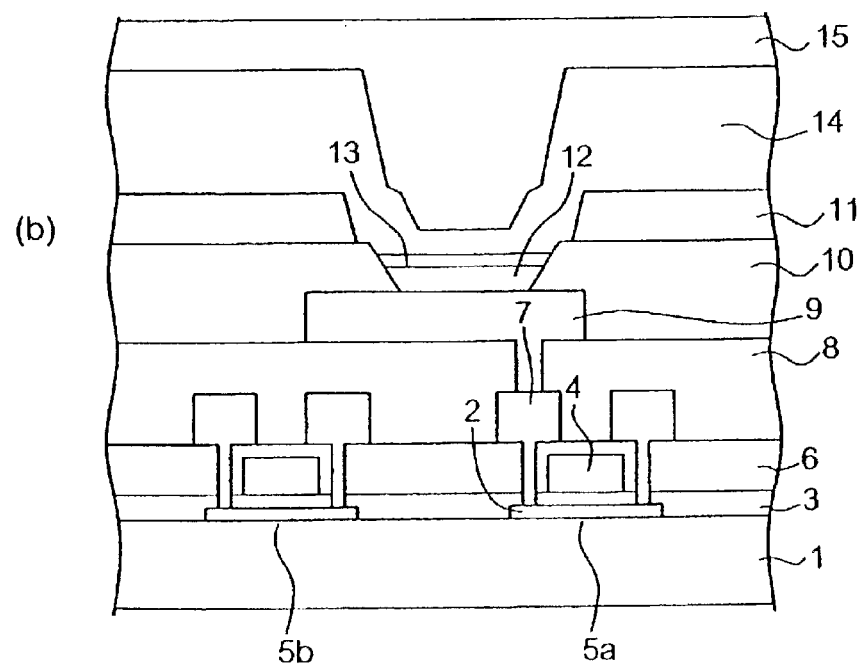

[FIG. 6]
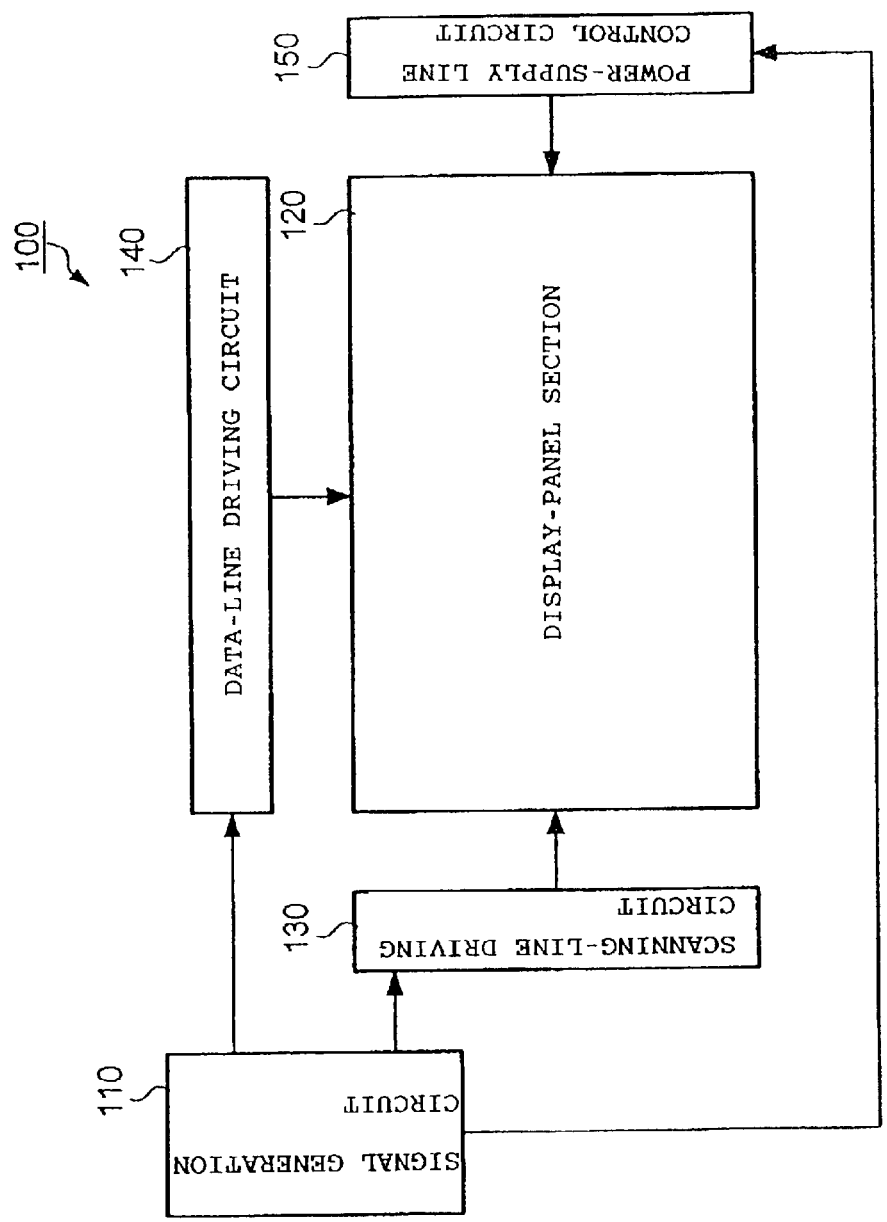

[FIG. 7]
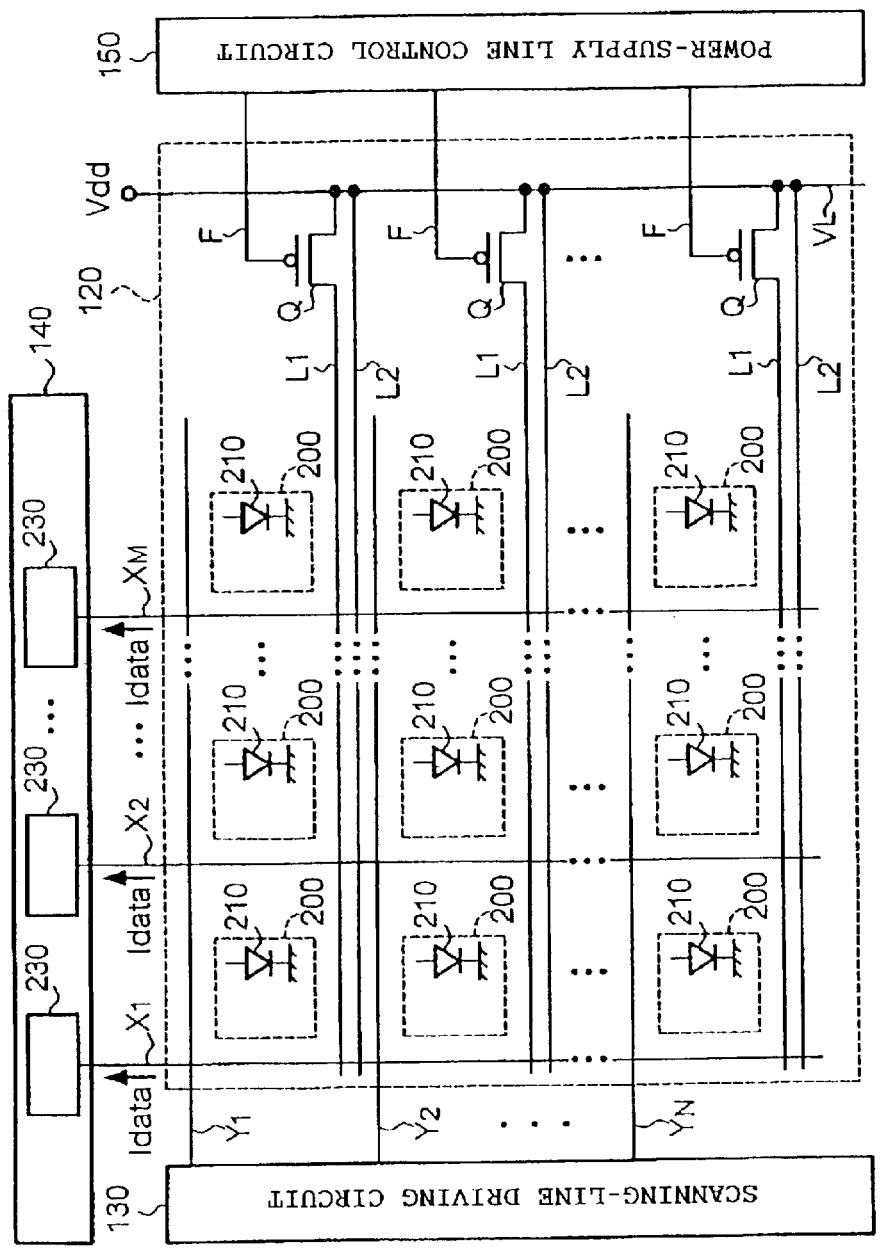

[FIG. 8]
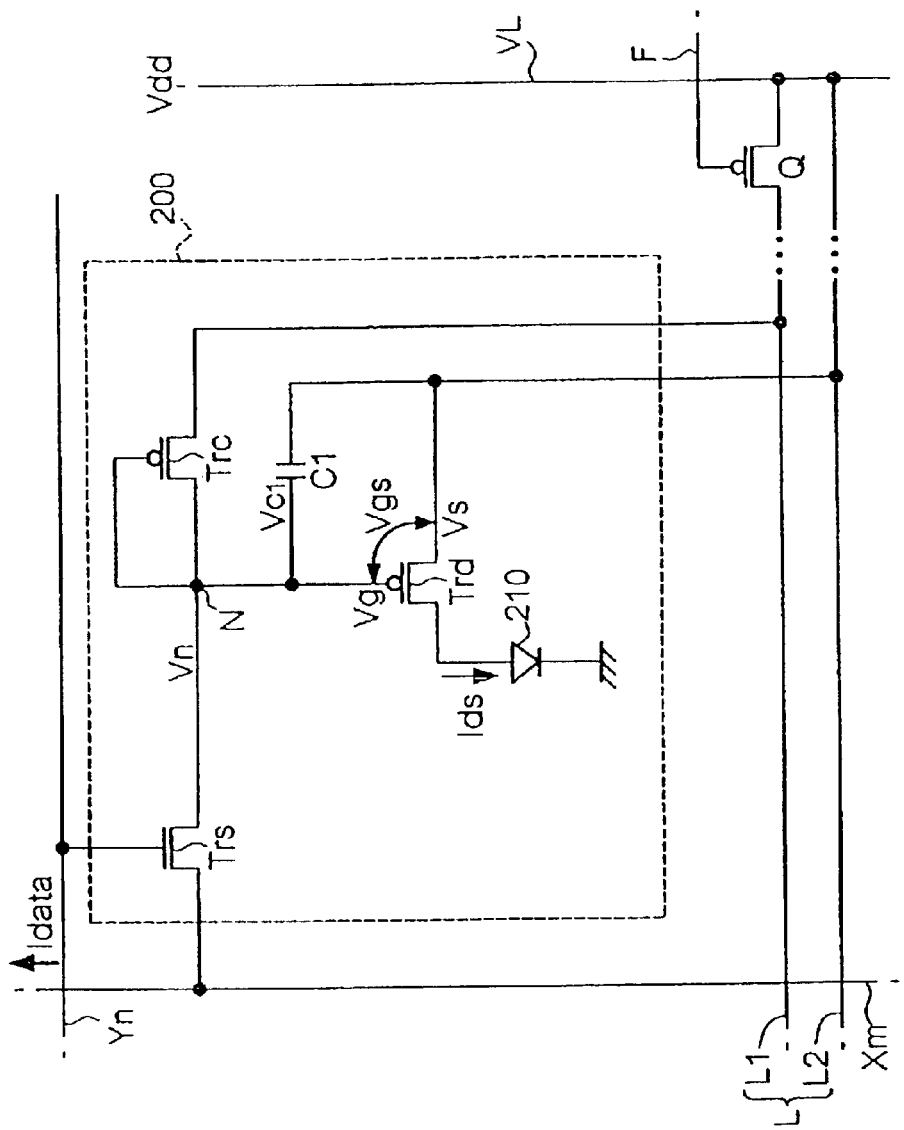

[FIG. 9]
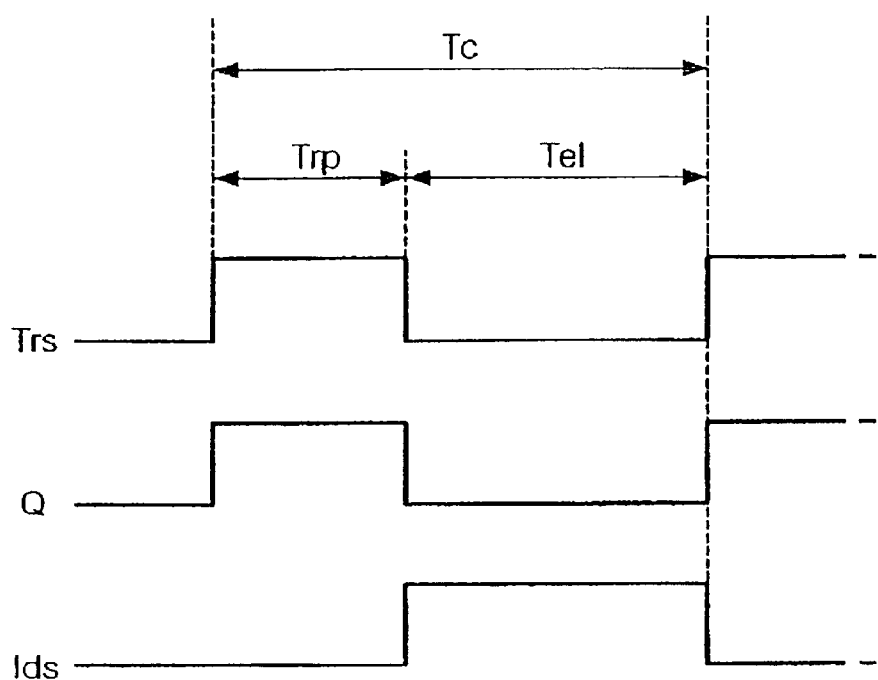

[FIG. 10]
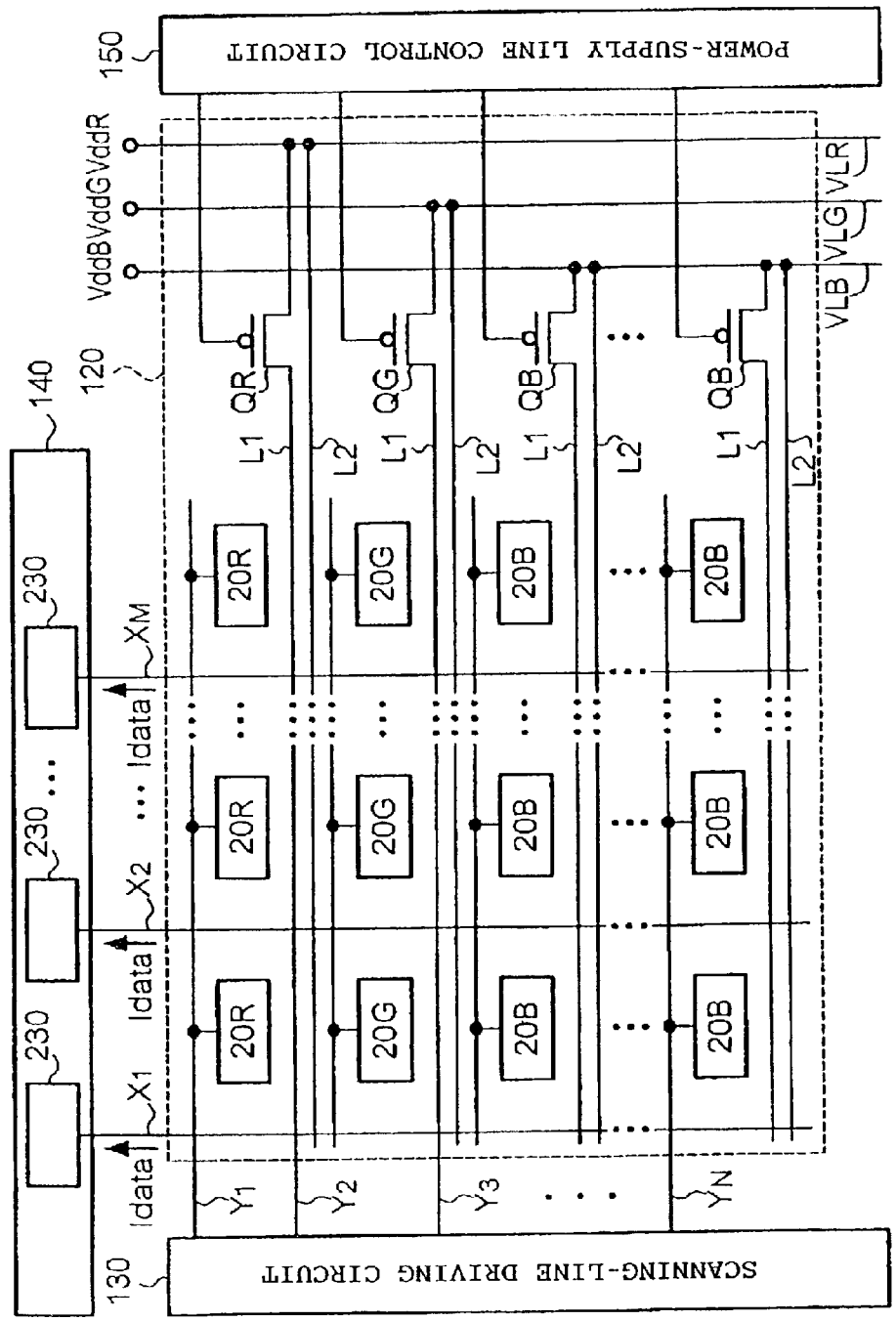

[FIG. 11]
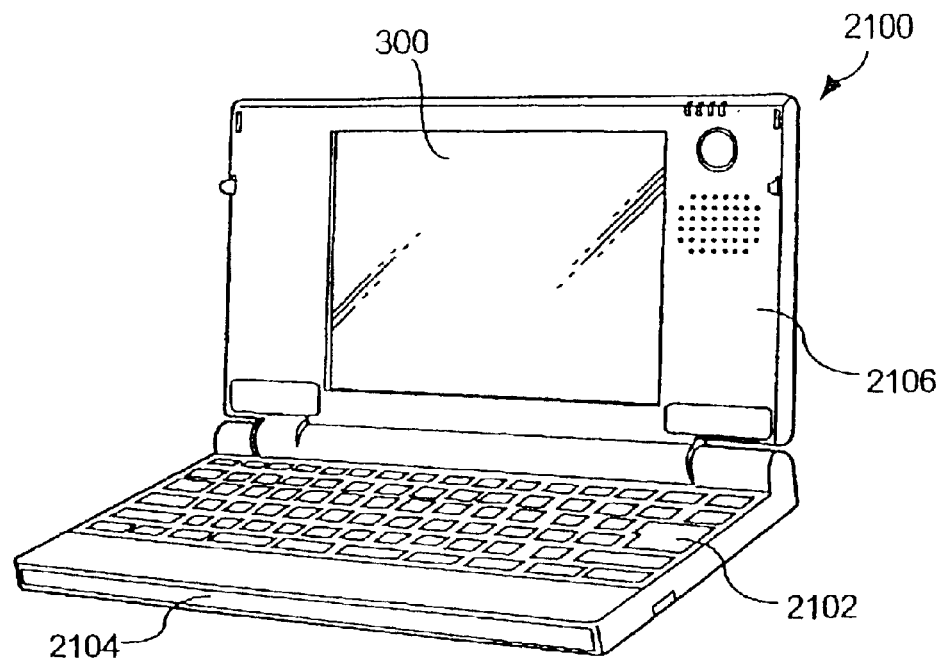
[FIG. 12]
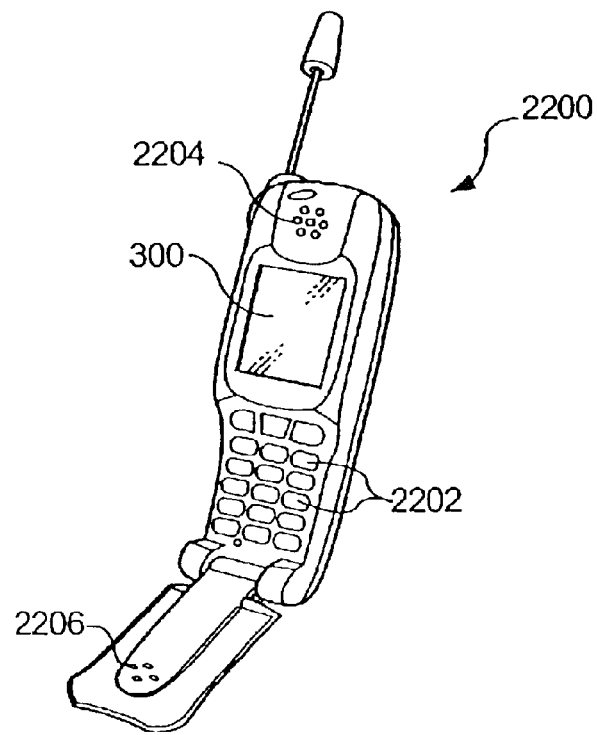

[FIG. 13]
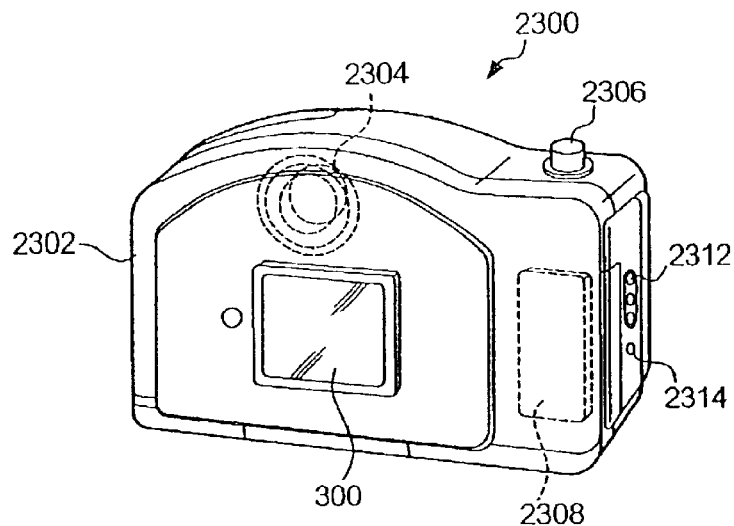
[FIG. 14]
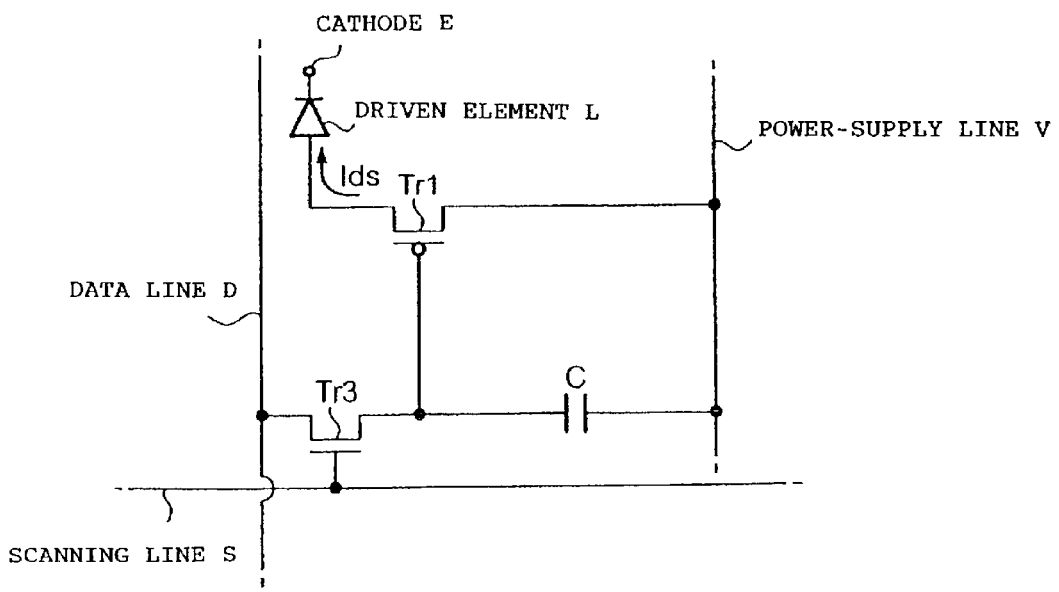

UNIT CIRCUIT, ELECTRONIC CIRCUIT, ELECTRONIC APPARATUS, ELECTRO-OPTIC APPARATUS, DRIVING METHOD, AND ELECTRONIC EQUIPMENT

BACKGROUND OF THE INVENTION

1. Field of Invention

The present invention relates to a unit circuit, an electronic circuit, an electro-optic apparatus, a driving method, and electronic equipment which can compensate for variations in the characteristics of transistors to drive current-type driven elements, such as organic electroluminescent elements.

2. Description of Related Art

Recently, organic EL (electroluminescent) elements have attracted attention as becoming the next-generation light-emitting devices to replace conventional LCD (Liquid-Crystal Display) elements. Organic EL elements have excellent characteristics when used in display panels, for example, they are subject to a smaller dependence on the viewing angle because they are self-luminous, and they consume less power because they do not need a backlight or reflected light.

Examples of a related art circuit to drive such an organic EL element include the configuration shown in FIG. 14. In this circuit, the drain of a driving transistor Tr1 is connected to a current-type driven element L (organic EL element) via a hole injection electrode. The gate of a switching transistor Tr3 is connected to a scanning line S, the source thereof is connected to a data line D, and the drain thereof is connected to the gate of the driving transistor Tr1 and one end of a capacitor element C. The other end of the capacitor element C is connected to a power-supply line V. The on/off state of the switching transistor Tr3 is controlled by a selection electrical potential supplied from the scanning line S to the gate, and electrical charge is stored in the capacitor element C by a signal voltage supplied from the data line D during the on period.

Then, a voltage across the terminals of the capacitor element C, which is due to this electrical charge, causes a voltage to be applied to the gate of the driving transistor Tr1, and an electrical current Ids corresponding to this voltage is supplied from the power-supply line V to the driven element L. The conductance between the source and the drain of the driving transistor Tr1 is controlled according to the voltage applied to the gate of the driving transistor Tr1, thus determining the luminance of the organic EL element, which is the driven element L.

SUMMARY OF THE INVENTION

However, in a process for manufacturing a display panel in which the above-described circuits are used, the characteristics of the driven element L forming a pixel can be formed relatively uniformly over the pixels of the display panel. However, it is difficult to make the characteristics of the driving transistor Tr1 uniform over the pixels of the display panel due to various conditions, such as the properties and the thickness of semiconductor films, impurity concentration, diffusion areas, material properties and thickness of a gate insulating film, and the operating temperature.

When each transistor in the above-described circuit is formed by a thin-film transistor, variations in the characteristics of each transistor are likely to occur. When, in particular, a display panel is formed using the above-described circuits, variations in the electrical current characteristics between the drain and the source with respect to the gate voltage of the driving transistor Tr1 become a problem. That is, even if a common voltage is applied to the gate of the driving transistor Tr1 of each pixel, the amount of electrical current which flows through the organic EL element differs for each pixel due to the presence of the above-mentioned variations, causing variations to occur in the light-emitting luminance of each pixel, and the image quality of the display panel is greatly deteriorated.

In view of such circumstances, a circuit to compensate for variations in driving transistors to drive current-type driven elements is necessary.

The present invention addresses such circumstances, and provides a unit circuit, an electronic circuit, an electro-optic apparatus, a driving method, and electronic equipment in which the influence of variations in characteristics of a driving transistors reduced, thus allowing target electrical currents to be supplied to current-type driven elements, such as organic EL elements.

To address the above-mentioned circumstances, the present invention provides a unit circuit including: a driven element; a driving transistor to control the amount of electrical current to the driven element; a capacitor element connected to the gate of the driving transistor; and a diode-connected compensating transistor, which is directly connected to the gate. The conducting state of the driving transistor is set according to a data current, supplied as a data signal, which passes through the compensating transistor. According to this configuration, for example, since the compensating transistor is directly connected to the gate of the driving transistor, these two transistors are provided in proximity to each other. As a result, it becomes easy to make the characteristics of the two transistors uniform or to adjust the ratio of characteristics. Furthermore, a data current which passes through the compensating transistor is directly reflected in the amount of electrical current controlled by the driving transistor. The unit circuit may further include a first switching transistor which is connected in series with the compensating transistor via one of the source and the drain thereof. Preferably, the other one of the source and the drain of the first switching transistor is connected to a signal line, and when the signal line and the compensating transistor are electrically connected to each other via the first switching transistor, the data current passes through the compensating transistor.

Furthermore, to address the above-mentioned circumstances, the present invention provides a unit circuit including: a driven element; a driving transistor to control the amount of electrical current to the driven element; a capacitor element connected to the gate of the driving transistor; a first switching transistor connected to the gate of the driving transistor; a first signal line connected to the gate of the first switching transistor; a second signal line connected to one of the source and the drain of the first switching transistor; and a power line to which a power-supply voltage is applied. A compensating transistor and a second switching transistor, which are connected in series with each other, are provided between the power line and the other one of the source and the drain of the first switching transistor, the compensating transistor is diode-connected, and the gate of the second switching transistor is connected to a third signal line differing from the first signal line. Furthermore, the present invention provides a unit circuit including: a current-driven driven element; a driving transistor to control the amount of electrical current to the driven element; a capacitor element connected to the gate of the driving transistor; a first switching transistor connected to the gate of the driving transistor; a first signal line connected to the gate of the first switching transistor; a second signal line connected to one of the source and the drain of the first switching transistor; and a power line to which a power-supply voltage is applied. A compensating transistor and a second switching transistor, which are connected in series with each other, are provided between the power line and the other one of the source and the drain of the first switching transistor, the compensating transistor is diode-connected, and the gate of the second switching transistor is connected to the first signal line. In either configuration, it becomes possible to compensate for variations of the driving transistor. When the former is compared with the latter, in the configuration of the latter, since the gates of the first and second switching transistors are connected to the same first signal line, a third signal line is not required, making it possible to reduce the number of wiring lines. The diode-connected transistor refers to a transistor in a state in which the source or the drain thereof is connected to the gate. In the configuration of the former, preferably, a period in which both the first switching transistor and the second switching transistor are turned on is provided.

Here, in the configurations of the former and the latter, preferably, the second signal line is a data line which supplies an electrical current as a data signal.

Furthermore, electrical charge, corresponding to the amount of electrical current which flows through the compensating transistor, may be stored in the capacitor element.

In the driving transistor and the compensating transistor, preferably, electrical-current characteristics between the source and the drain with respect to the gate voltage are substantially the same, and the amount of electrical current which flows through the compensating transistor may be larger than the amount of electrical current controlled by the driving transistor.

Furthermore, preferably, the driven element is an organic electroluminescent element.

Furthermore, preferably, the driving transistor, the first and second switching transistors, and the compensating transistor are thin-film transistors, and the driving transistor is preferably a p-channel type which changes little over time.

To address the above-mentioned circumstances, the present invention provides a unit circuit including: a first switching transistor which is turned on or off in accordance with a scanning signal supplied to a first scanning line, one of the source and the drain thereof being connected to a data line; a compensating transistor which functions as a diode; a second switching transistor which is turned on or off in accordance with a scanning signal supplied to a second scanning line differing from the first scanning line, the compensating transistor and the second switching transistor being connected in series with each other between a power line to which a power-supply voltage is applied and the other one of the source and the drain of the first switching transistor; a driving transistor, whose gate is connected to the other one of the source and the drain of the first switching transistor, to drive the driven element; and a capacitor element to hold the gate voltage of the driving transistor.

Furthermore, the present invention provides a unit circuit including: a first switching transistor which is turned on or off in accordance with a scanning signal supplied to a first scanning line, one of the source and the drain thereof being connected to a data line; a compensating transistor which functions as a diode; a second switching transistor which is turned on or off in accordance with a scanning signal supplied to the first scanning line, the compensating transistor and the second switching transistor being connected in series with each other between a power line to which a power-supply voltage is applied and the other one of the source and the drain of the first switching transistor; a driving transistor, whose gate is connected to the other one of the source and the drain of the first switching transistor, to drive the driven element; and a capacitor element to hold the gate voltage of the driving transistor. In either configuration, it becomes possible to compensate for variations of the driving transistor. Here, when the former is compared with the latter, in the configuration of the latter, since the gates of the first and second switching transistors are connected to the same scanning line, a second scanning line is not required, making it possible to reduce the number of wiring lines.

To address the above-mentioned circumstances, the present invention provides a unit circuit including: a switching transistor which is turned on or off in accordance with a scanning signal supplied to a scanning line, one of the source and the drain thereof being connected to a data line; a compensating transistor, which functions as a diode, between a first power line to which a first power-supply voltage is applied during at least a part or the whole of a period in which the switching transistor is turned on and the other one of the source and the drain of the switching transistor; a driving transistor, whose gate is connected to the other one of the source and the drain of the switching transistor, one of the source and the drain thereof being connected to a second power line to which a second power-supply voltage is applied, to drive the driven element; and a capacitor element to hold the gate voltage of the driving transistor.

Furthermore, the present invention provides a unit circuit including: a switching transistor whose gate is connected to a scanning line to which a scanning signal is supplied, one of the source and the drain thereof being connected to a data line; a compensating transistor whose gate is connected to the source or the drain thereof, one of the source and the drain being connected to a first power line to which a first power-supply voltage is applied during at least a part or the whole of a period in which the switching transistor is turned on in accordance with the scanning signal, and the other one of the source and the drain of the compensating transistor being connected to the other one of the source and the drain of the switching transistor; a driving transistor, whose gate is connected to the other one of the source and the drain of the switching transistor, one of the source and the drain of the driving transistor being connected to a second power line to which a second power-supply voltage is applied, to drive the driven element; and a capacitor element, one end thereof being connected to the gate of the driving transistor. In either configuration, it is possible to compensate for variations of the driving transistor, and possible to decrease the number of transistors by one.

Preferably, the first power-supply voltage and the second power-supply voltage are substantially equal.

Furthermore, various electronic apparatuses, such as electro-optic apparatuses, storage devices, or sensor devices, may be formed by using at least one of the unit circuits. For example, if the unit circuit is used as a pixel circuit, the electro-optic apparatus can be formed. Such an electro-optic apparatus may be installed in electronic equipment.

To address the above-mentioned circumstances, the present invention provides an electronic circuit including a plurality of unit circuits, each of the plurality of unit circuits including: a driving transistor including a first terminal and a second terminal; a compensating transistor including a third terminal and a fourth terminal, the third terminal being connected to the gate of the driving transistor; a switching transistor including a fifth terminal and a sixth terminal, the fifth terminal being connected to the gate of the driving transistor and the third terminal; and a capacitor element to hold the amount of electrical charge corresponding to an electrical current flowing through the compensating transistor and the switching transistor, one end of the capacitor element being connected to the gate of the driving transistor. The fourth terminal, together with the fourth terminals of the other unit circuits among the plurality of unit circuits, is connected to a first power line, the second terminal is connected to a second power line, and a control circuit to set the first power line to a plurality of electrical potentials or to control the disconnection/connection between the first power line and the power-supply electrical potential is provided. According to this configuration, it is possible to compensate for the threshold voltage of the driving transistor with a simple configuration.

In this electronic circuit, no transistor other than the driving transistor, the compensating transistor, and the switching transistor exists in each of the unit circuits. Therefore, it is possible to decrease the number of transistors to be used by one in comparison with a related art case while the threshold voltage of the driving transistor is compensated for.

In this electronic circuit, the gate of the compensating transistor is connected to the third terminal. Therefore, the electrical current flowing through the driving transistor can be controlled by a voltage charged into the capacitor element.

In this electronic circuit, the conduction types of the driving transistor and the compensating transistor are the same. According to this configuration, compensation of the driving transistor can easily be performed.

In this electronic circuit, an electronic element is connected to the first terminal. Since the threshold voltage of the driving transistor is compensated for, the value of the electrical current flowing through the electronic elements can be controlled with high accuracy. As the electronic element, a current-driven driven element is used.

In this electronic circuit, the control circuit is a transistor comprising a seventh terminal and an eighth terminal, the seventh terminal is connected to a power source, and the eighth terminal is connected to the first power line. According to this configuration, it is possible to easily configure a control circuit.

In this electronic circuit, while electrical current is flowing through the compensating transistor and the switching transistor, the electrical potentials of at least the first power line and the second power line are set so as to become substantially the same electrical potential. According to this configuration, it is possible to reliably supply a voltage which is substantially equal to the threshold voltage of the driving transistor, generated in the compensating transistor, to the gate of the driving transistor.

In this electronic circuit, the first power line and the second power line can be electrically connected to power supplies having the same electrical potential. Accordingly, it is possible to easily make the voltages supplied to the first power line and the second power line substantially equal to each other.

In this electric circuit, a threshold voltage of the driving transistor is set so as not to be higher than a threshold voltage of the compensating transistor. According to this configuration, it is possible to reliably compensate for the threshold voltage of the driving transistor.

In this electronic circuit, preferably, the amount of electrical current which flows through the compensating transistor is larger than the amount of electrical current controlled by the driving transistor. According to this configuration, when the switching transistor is turned on, electrical charge corresponding to the amount of electrical current flowing through the switching transistor and the compensating transistor can be quickly stored in the capacitor element.

Various electronic apparatuses, such as electro-optic apparatuses, storage devices, or sensor devices, may be formed by using at least one of the unit circuits.

The present invention provides an electro-optic apparatus including a plurality of unit circuits, each of the plurality of unit circuits including: a driving transistor including a first terminal and a second terminal; a compensating transistor including a third terminal and a fourth terminal, the third terminal being connected to the gate of the driving transistor; a switching transistor including a fifth terminal and a sixth terminal, the fifth terminal being connected to the gate of the driving transistor and the third terminal; an electro-optic element connected to the first terminal; and a capacitor element to hold the amount of electrical charge corresponding to electrical current flowing through the compensating transistor and the switching transistor, one end of the capacitor element being connected to the gate of the driving transistor. The first power line connected to the fourth terminal is also commonly connected to the fourth terminal of at least another unit circuit among the plurality of unit circuits, the second terminal is connected to a second power line, and a control circuit to set the first power line to a plurality of electrical potentials or to control the disconnection/connection between the first power line and the power-supply potential. According to this configuration, since the number of transistors to be used is decreased by one in comparison with a related art case while the threshold voltage is compensated for, it becomes possible to enhance the aperture ratio and to enhance the display quality. Furthermore, since the number of transistors which form a unit circuit is decreased by one in comparison with a related art case, it becomes possible to enhance the yield.

In this electronic circuit, the electro-optic element is an organic EL element. According to this configuration, by decreasing the number of transistors to be used by one in comparison with a related art case, the aperture ratio can be enhanced and the luminance gradation of the organic EL element can be controlled with high accuracy.

In this electro-optic apparatus, the control circuit is a transistor including a seventh terminal and an eighth terminal, the seventh terminal is connected to a power source, and the eighth terminal is connected to the first power line. It is possible to easily configure a unit circuit in which the number of transistors to be used is decreased by one in comparison with a related art case while the threshold voltage of the driving transistor is compensated for.

In this electro-optic apparatus, while electrical current is flowing through the compensating transistor and the switching transistor, the electrical potentials of at least the first power line and the second power line are set so as to become substantially the same electrical potential. According to this configuration, it is possible to reliably supply a voltage which is substantially equal to the threshold voltage of the driving transistor, generated in the compensating transistor, to the gate of the driving transistor. In this electro-optic apparatus, the first power line and the second power line can be electrically connected to power supplies having the same electrical potential. According to this configuration, it is possible to make the voltages supplied to the first power line and the second power line connected to the unit circuit substantially equal to each other.

In this electro-optic apparatus, the threshold voltage of the driving transistor is set so as not to be higher than a threshold voltage of the compensating transistor. According to this configuration, it is possible to reliably compensate for the threshold voltage of the driving transistor. Therefore, it is possible to control the luminance gradation of the electro-optic element with high accuracy.

The present invention provides an electro-optic apparatus including a plurality of scanning lines, a plurality of data lines, unit circuits each arranged to correspond to each intersection of the plurality of scanning lines and the plurality of data lines, and a plurality of first power lines, each of the unit circuits including: a driving transistor including a first terminal and a second terminal; a compensating transistor including a third terminal and a fourth terminal, the third terminal being connected to the gate of the driving transistor; a switching transistor including a fifth terminal and a sixth terminal, the fifth terminal being connected to the gate of the driving transistor and the third terminal; an electro-optic element connected to the first terminal; and a capacitor element to hold the amount of electrical charge corresponding to electrical current flowing through the compensating transistor and the switching transistor, one end of the capacitor element being connected to the gate of the driving transistor. The gates of the switching transistors contained in a series of unit circuits are commonly connected to one scanning line, and the fourth terminals in the series of unit circuits are commonly connected to one first power line, and a control circuit to set the first power line to a plurality of electrical potentials or to control the disconnection/connection between the first power line and the power-supply electrical potential. According to this configuration, since the number of transistors to be used is decreased by one in comparison with a related art case while the threshold voltage of all the driving transistors provided within the unit circuit is compensated for, it becomes possible to increase the aperture ratio and to enhance the display quality. Furthermore, since the number of transistors which forms a unit circuit can be decreased by one in comparison with a related art case, it becomes possible to enhance the yield.

In this electro-optic apparatus, the second terminals in the series of unit circuits are commonly connected to one second power line. According to this configuration, it becomes possible to enhance the display quality.

In this electro-optic apparatus, the gate of the compensating transistor is connected to its third terminal. According to this configuration, it is possible to reliably supply a voltage which is substantially equal to the threshold voltage of the driving transistor, generated in the compensating transistor, to the gate of the driving transistor.

In this electro-optic apparatus, the electro-optic element is an organic EL element. According to this configuration, it is possible to control the luminance gradation of the organic EL element with high accuracy. In this electro-optic apparatus, electro-optic elements of the same color are arranged along the scanning line. According to this configuration, the aperture ratio can be enhanced even more.

The present invention provides a method of driving an electronic circuit including a plurality of unit circuits including: a driving transistor including a first terminal and a second terminal; a compensating transistor including a third terminal and a fourth terminal, the third terminal being connected to the gate of the driving transistor; a switching transistor including a fifth terminal and a sixth terminal, the fifth terminal being connected to the gate of the driving transistor and the third terminal; and a capacitor element, one end thereof being connected to the gate of the driving transistor. The fourth terminals in the series of unit circuits are commonly connected to a first power line. The method includes the steps of: electrically connecting each of the fourth terminals of the series of unit circuits to a predetermined electrical potential, turning on each of the switching transistors contained in the series of unit circuits, thereby holding in capacitor elements the amount of electrical charge corresponding to the electrical currents flowing through the compensating transistors, applying a voltage corresponding to the amount of electrical charge to the driving transistors, and setting the conduction state between the first terminals and the second terminals; and electrically disconnecting each of the fourth terminals of the series of unit circuits from the predetermined electrical potential. According to this configuration, it is possible to compensate for the threshold voltage of the driving transistor and to drive the electronic circuit.

The present invention provides a method of driving an electro-optic apparatus in which a unit circuit including: a driving transistor including a first terminal and a second terminal; a compensating transistor including a third terminal and a fourth terminal, the third terminal being connected to the gate of the driving transistor; a switching transistor including a fifth terminal and a sixth terminal, the fifth terminal being connected to the gate of the driving transistor and the third terminal; an electro-optic element connected to the first terminal; and a capacitor element, one end thereof being connected to the gate of the driving transistor, is arranged to correspond to each intersection of a plurality of scanning lines and a plurality of data lines, and the gates of the switching transistors contained in a series of unit circuits are commonly connected to one scanning line, and the fourth terminals in the series of unit circuits are commonly connected to one first power line. The method includes the steps of: electrically connecting each of the fourth terminals of the series of unit circuits to a predetermined electrical potential, supplying a scanning signal to each of the gates of the switching transistors contained in the series of unit circuits so as to be turned the switching transistors on, holding in a capacitor element the amount of electrical charge corresponding to the level of the electrical current flowing through the compensating transistor during a period in which electrical connection with the corresponding data line of the plurality of data lines is made, applying a voltage corresponding to the amount of electrical charge to the first gate, and setting a conduction state between the first terminal and the second terminal; and electrically disconnecting each of the fourth terminals of the series of unit circuits from the predetermined electrical potential. According to this configuration, it is possible to compensate for the threshold voltage of the driving transistor and to drive the electro-optic apparatus.

Since the electronic equipment of the present invention has installed therein the electric circuit or the electro-optic apparatus, the threshold voltage of the driving transistor within the circuit can be compensated for. Furthermore, since the number of transistors to be used can be decreased by one in comparison with the related art case, it becomes possible to enhance the yield of the electronic equipment.

BRIEF DESCRIPTION OF THE DRAWINGS

FIG. 1 is a schematic showing a configuration of an electro-optic apparatus in which a unit circuit according to a first embodiment of the present invention is used;

FIGS. 2(a), 2(b) and 2(c) are schematics that each show a configuration of a pixel circuit as a unit circuit;

FIG. 3 is a timing chart illustrating a method of driving the pixel circuit;

FIGS. 4(a) to 4(d) are schematics that each show a part of a process for manufacturing an electro-optic apparatus;

FIGS. 5(a) and 5(b) are schematics that each show a part of a process for manufacturing an electro-optic apparatus;

FIG. 6 is a schematic showing a configuration of an electro-optic apparatus in which a unit circuit according to a second embodiment of the present invention is used;

FIG. 7 is a schematic that shows a configuration of a display panel, etc., in the electro-optic apparatus;

FIG. 8 is a schematic that shows a configuration of a pixel circuit as the unit circuit;

FIG. 9 is a timing chart illustrating a method of driving the pixel circuit;

FIG. 10 is a schematic that shows a configuration of a display panel, etc., within an electro-optic apparatus according to an application example of the second embodiment;

FIG. 11 is a perspective view showing a configuration of a mobile personal computer in which an electro-optic apparatus including a unit circuit according to the embodiment is used;

FIG. 12 is a perspective view showing a configuration of a portable phone in which an electro-optic apparatus is used;

FIG. 13 is a perspective view showing a configuration of a digital still camera in which an electro-optic apparatus is used;

FIG. 14 is a schematic that shows an example of a related art unit circuit to drive a current-type driven element.

DETAILED DESCRIPTION OF PREFERRED EMBODIMENTS

Embodiments of the present invention will be described below with reference to the drawings.

First Embodiment

A first embodiment of the present invention will be described first. FIG. 1 shows the configuration of an electro-optic apparatus in which a unit circuit according to a first embodiment is used. As shown in FIG. 1, in this electro-optic apparatus, a plurality of scanning lines (S1, S2, S3, . . . ) and a plurality of data lines (D1, D2, D3, . . . ) are arranged so as to intersect each other, and a matrix of pixel circuits 20, which is an example of a unit circuit according to this embodiment, is provided, one at each intersection.

A scanning-line driving circuit 130 applies a selection electrical potential Vsel at a predetermined timing to each of the scanning lines S1, S2, S3, . . . A data-line driving circuit 140 applies data current Idata, each as a data signal, to the data lines D1, D2, D3, . . .

In FIG. 1, a power-supply line V (to be described below) is omitted. Furthermore, in this description, the portion where the pixel circuits 20 are arranged in a matrix is sometimes referred to as a display panel. Although in this embodiment, one of pixels to be displayed corresponds to one pixel circuit 20, one pixel may be displayed by a plurality of sub-pixels.

FIG. 2(a) is a circuit diagram showing a detailed configuration of the pixel circuit 20 as a unit circuit according to this embodiment. The pixel circuit in FIG. 2(a) is one of general pixel circuits corresponding to the intersection of a scanning line S and a data line D.

In FIG. 2(a), a driven element L is, for example, a current-driven organic EL element, and in FIG. 2(a), this element is represented as a diode. This unit circuit includes, in addition to the driven element L, a driving transistor Tr1, a switching transistor Tr2 (second switching transistor), a switching transistor Tr3 (first switching transistor), a compensating transistor Tr4, and a capacitor element C to store electrical charge. Among them, both the driving transistor Tr1 and the compensating transistor Tr4 are p-channel-type thin-film transistors (TFTs) which change little over time, and the switching transistors Tr2 and Tr3 are n-channel-type TFTs.

The selection as to which conduction type, either p-channel type or n-channel type, is used for each transistor is not limited to those shown here. Furthermore, the conduction types (whether the conduction type is n-channel type or p-channel type) of the switching transistors Tr2 and Tr3 may differ from each other. However, when the conduction types of the switching transistors Tr2 and Tr3 are different from each other, it is necessary to separately provide, in addition to the scanning line S, a scanning line which takes a logic level which is exclusive thereto, and necessary to connect the gate of a p-channel type switching transistor.

One end of the driven element L is connected to the drain of the driving transistor Tr1 via a hole injection electrode (not shown), whereas the other end of the driven element L is connected to a cathode E.

Furthermore, the source of the driving transistor Tr1 is connected to the power-supply line V, whereas the gate thereof is connected to one end of the capacitor element C, the drain of the switching transistor Tr3, and the drain of the transistor Tr4. The other end of the capacitor element C is connected to the power-supply line V.

The drain of the compensating transistor Tr4 is connected to its gate. Therefore, the compensating transistor Tr4 is diode-connected.

The drain and the gate of the compensating transistor Tr4 are connected to one end (the gate of the driving transistor Tr1 and the drain of the switching transistor Tr3) of the capacitor element C, and the source of the compensating transistor Tr4 is connected to the source of the switching transistor Tr2. The drain of the switching transistor Tr2 is connected to the power-supply line V. The source of the switching transistor Tr3 is connected to the data line D, and the gates of the switching transistors Tr2 and Tr3 are each connected to the scanning line S.

Next, the operation of the unit circuit of FIG. 2(a) will be described. The on/off state of the switching transistors Tr2 and Tr3 is controlled by a selection electrical potential Vsel applied to each gate via the scanning line S. In this embodiment, since both the switching transistors Tr2 and Tr3 are n-channel types, these are turned on when the selection electrical potential Vsel reaches a high level. When data current Idata is supplied via the data line D when the switching transistors Tr2 and Tr3 are on, the electrical potentials of the gate and the source of the compensating transistor Tr4 become equal. Therefore, the following state is reached in the compensating transistor Tr4:

Vgs (difference of electrical potentials between the gate and the source)=Vds (difference of electrical potentials between the drain and the source), an electrical charge corresponding to this state is stored in the capacitor element C, and as a result, the voltage across the terminals of the capacitor element C is applied to the gate of the driving transistor Tr1. That is, the gate voltage of the driving transistor Tr1 is controlled by the amount of the data current Idata supplied from the data line D, thereby the amount of electrical current between the drain and the source of the driving transistor Tr1 is controlled, and the value of electrical current Ids which flows through the driven element L is controlled.

In the above-described circuit, the driving transistor Tr1 and the compensating transistor Tr4 form what is commonly referred to as a current mirror circuit, and the value of the electrical current Ids between the drain and the source of the driving transistor Tr1, that is, the value of the electrical current supplied to the driven element L, is proportional to the amount of electrical current between the drain and the source of the compensating transistor Tr4.

Furthermore, the ratio of the electrical current Ids between the drain and the source of the driving transistor Tr1 to the data current Idata which flows through the drain and the source of the compensating transistor Tr4 is determined by the characteristics of the driving transistor Tr1 and the compensating transistor Tr4. Therefore, by making the gain coefficients (the amount of electrical current which flows through the transistor when a fixed voltage is applied to the gate and the source of the transistor), which are one of the characteristics between the driving transistor Tr1 and the compensating transistor Tr4, match, it is possible to make the electrical current Ids flowing through driving transistor Tr1 match the data current Idata flowing through the compensating transistor Tr4. In particular, in this embodiment, since the drain of the compensating transistor Tr4 is directly connected to the gate of the driving transistor Tr1, the data current Idata which passes through the compensating transistor Tr4 is directly reflected in the electrical current Ids controlled by the driving transistor, making it possible to enhance the matching.

For this reason, if the display panel is formed in such a manner that the gain coefficients of the driving transistor Tr1 and the compensating transistor Tr4 match each other, even if a variation occurs in the driving transistor Tr1 formed for each of the pixels of the display panel, an electrical current Ids of the same magnitude can be supplied to the driven element L contained in each pixel of the display panel. Therefore, luminance variations due to variations in the characteristics of the driving transistors Tr1 can be reduced or suppressed.

As is known in the related art, in a process for manufacturing a display panel containing a driven element L, it is easy to make the characteristics of transistors in proximity to each other match each other. In the manner described above, in this embodiment, the drain of the compensating transistor Tr4 is directly connected to the gate of the driving transistor Tr1, and these transistors are close to each other. For this reason, in the same pixel circuit, it is not difficult to form the configuration so that the gain coefficients of the driving transistor Tr1 and the compensating transistor Tr4 match each other. Therefore, it is relatively easy to manufacture a display panel with a small amount of luminance variation.

Furthermore, in this embodiment, the gate voltage of the driving transistor Tr1 is set according to the data current Idata supplied from the data-line driving circuit 140. Since the driving transistor Tr1 and the compensating transistor Tr4 form what is commonly referred to as a current mirror circuit, variations of the electrical current Ids between the drain and the source of the driving transistor Tr1 due to changes in temperature are reduced or suppressed, and stabilization can be achieved.

Although in the circuit of FIG. 2(a), the compensating transistor Tr4 is disposed between the switching transistor Tr2 and the switching transistor Tr3, as shown in FIG. 2(b), the compensating transistor Tr4 may be disposed between the switching transistor Tr2 and the power-supply line V. Also in this circuit, the electrical current Ids between the drain and the source of the driving transistor Tr1 is determined by the data current Idata which flows through the compensating transistor Tr4, as in the circuit shown in FIG. 2(a).

FIG. 3 is a timing chart illustrating the operation of the unit circuit shown in FIG. 2(a).

First, the selection electrical potential Vsel to be supplied to the scanning line S by the scanning-line driving circuit 130 is set to a high level, and the data-line driving circuit 140 supplies the data current Idata to the data line D.

When the selection electrical potential Vsel reaches a high level, both the switching transistors Tr2 and Tr3 are turned on. Consequently, the data current Idata flows through the path of the power-supply line V, the switching transistor Tr2, the compensating transistor Tr4, the switching transistor Tr3, and the data line D.

The gate voltage of the driving transistor Tr1 is determined according to this data current Idata, the electrical current Ids corresponding to the gate voltage is supplied to the power-supply line V, the driven element L emits light, and the gate voltage is held by the capacitor element C. Therefore, even when the selection electrical potential Vsel becomes low and both the switching transistors Tr2 and Tr3 are turned off, the electrical current Ids corresponding to the held gate voltage continues to flow through the driven element L. Therefore, the light-emitting state of the driven element L is maintained until the selection electrical potential Vsel becomes high again.

The gain coefficients of the driving transistor Tr1 and the compensating transistor Tr4 forming the current mirror circuit are not limited to the case where the gain coefficients are made to match each other in the manner described above, and can be set as appropriate according to various requests, such as the size of a display panel in which this unit circuit is used and the scanning frequency.

For example, the gain coefficient of the compensating transistor Tr4 may be greater than the gain coefficient of the driving transistor Tr1. According to such a configuration, since the data current Idata flowing through the compensating transistor Tr4 becomes larger than the electrical current Ids flowing through the driving transistor Tr1, the time required to store electrical charge in the capacitor element C can be shortened. As a result, it becomes possible to cope with a higher scanning frequency, which is required as the number of pixels of the display panel is increased and the size thereof is increased.

Contrary to this, the gain coefficient of the compensating transistor Tr4 may be smaller than the gain coefficient of the driving transistor Tr1. According to this configuration, since the data current Idata by the compensating transistor Tr4 becomes smaller than the electrical current Ids by the driving transistor Tr1, the power consumed during the storage of the electrical charge in the capacitor element C can be reduced.

In FIG. 2(a) or FIG. 2(b), both the gates of the switching transistors Tr2 and Tr3 in the pixel circuit 20 of the same row are connected to the same scanning line S. As an alternative to this configuration, as shown in FIG. 2(c), a scanning line S' differing from the scanning line S may be provided, that is, two scanning lines S and S' may be provided for one row, and the gates of the switching transistors Tr2 and Tr3 may be connected to different scanning lines S from each other. Here, when the two configurations are compared, a smaller area necessary for wiring is required for the configuration of the former (the configuration in which one scanning line is provided for the pixel circuit 20 of one row) in comparison with the configuration of the latter (the configuration in which two scanning lines are provided for the pixel circuit 20 of one row). Consequently, it becomes easy to enhance the aperture ratio as a result of ensuring an effective optical area.

Next, regarding the manufacturing process in the pixel circuit 20, a process for manufacturing TFTs and pixels is described below.

First, amorphous silicon is formed on a glass substrate 1 by PECVD using SiH4 or by LPCVD using Si2H6, and the amorphous silicon is polycrystallized by laser irradiation using an excimer laser, etc., and by solid-phase growth, to form a polycrystalline silicon layer 2 (see FIG. 4(a)).

The polycrystalline silicon layer 2 is patterned to form a gate insulating film 3, after which, furthermore, a gate 4 is formed (see FIG. 4(b)).

Then, an impurity, such as phosphorus or boron, is implanted using self-alignment into the polycrystalline silicon layer 2 by using the gate 4 as a mask, thus forming transistors 5a and 5b. Here, the conduction types of the transistors 5a and 5b are p-type and n-type, respectively. After a first interlayer insulating film 6 is formed, a contact hole is formed, and furthermore, the source and the drain 7 are formed (see FIG. 4(c)).

Then, after a second interlayer insulating film 8 is formed, a contact hole is formed, and furthermore, a pixel electrode 9 formed of ITO (Indium Tin Oxide) is formed (see FIG. 4(d)).

A close-contact layer 10 is formed in such a manner as to cover the second interlayer insulating film 8 and the pixel electrode 9 which are formed in this manner, and an opening is formed so as to correspond to a light-emitting area. Furthermore, an interlayer 11 is formed, and, in a similar manner, an opening is formed so as to correspond to a light-emitting area (see FIG. 5(a)).

Next, the wettability of the surface of the substrate is controlled by a plasma process using oxygen plasma or CF4 plasma. Thereafter, a hole injection layer 12 and a light-emitting layer 13 are each formed by a liquid-phase process and a vacuum process. Examples of the liquid-phase process include spin-coating, squeegee coating, and an ink-jet process. Examples of the vacuum process include sputtering and vapor deposition. Furthermore, a cathode 14 containing metal, such as aluminum, is formed. Finally, a sealing layer 15 is formed, thus completing the organic EL element (see FIG. 5(b)).

Here, the roles of the close-contact layer 10 are to enhance the close contact between the substrate and the interlayer 11 and to obtain an accurate light-emitting area. Furthermore, the roles of the interlayer 11 are to move the cathode 14 away from the gate 4 and the source and the drain 7 in order to reduce the parasitic capacitance and to control the surface wettability in order to be capable of performing accurate patterning when the hole injection layer 12 and the light-emitting layer 13 are formed by a liquid-phase process. An electron transport layer (not shown) may be provided on the light-emitting layer 13.

Second Embodiment

In the above-described first embodiment, for example, by forming the configuration in such a manner that the gain coefficients of the driving transistor Tr1 and the compensating transistor Tr4 become the same, the electrical current Ids between the drain and the source of the driving transistor Tr1 can be made to match the data current Idata flowing through the drain and the source of the compensating transistor Tr4. For this reason, even if variations in characteristics occur in the driving transistor Tr1, the electrical current Ids of the same magnitude can be supplied to the driven element L over all pixels, and thus luminance variations due to variations in the characteristics of the driving transistors can be reduced or suppressed.

However, in the first embodiment, as is clear from FIG. 2(a) or FIG. 2(b), a total of four transistors per pixel is necessary. For this reason, when viewed as a display panel, a decrease in the yield and a decrease in the aperture ratio corresponding to the number of transistors are likely to occur.

Accordingly, a description is provided below of a second embodiment in which luminance variations due to variations in characteristics of the driving transistors Tr1 are reduced or suppressed, and furthermore, the number of transistors necessary in one pixel is decreased.

FIG. 6 is a schematic showing the configuration of an organic EL display in which a unit circuit according to the second embodiment is used.

As shown in FIG. 6, an organic EL display 100 includes a signal generation circuit 110, a display-panel section 120, a scanning-line driving circuit 130, a data-line driving circuit 140, and a power-line control circuit 150.

The signal generation circuit 110, the scanning-line driving circuit 130, the data-line driving circuit 140, and the power-line control circuit 150 in the organic EL display 100 may be formed by electronic parts which are independent of each other. For example, each of the signal generation circuit 110, the scanning-line driving circuit 130, the data-line driving circuit 140, and the power-line control circuit 150 may be formed by a one-chip semiconductor integrated-circuit device. Furthermore, the whole or a part of the signal generation circuit 110, the scanning-line driving circuit 130, the data-line driving circuit 140, and the power-line control circuit 150 may be formed by programmable IC chips, and the functions thereof may be realized in software by a program written into the IC chips.

The signal generation circuit 110 generates a scanning control signal and a data control signal to display an image on the display-panel section 120 on the basis of image data from an external device (not shown). Then, the signal generation circuit 110 outputs the scanning control signal to the scanning-line driving circuit 130 and outputs the data control signal to the data-line driving circuit 140. Furthermore, the signal generation circuit 110 outputs a timing control signal to the power-line control circuit 150.

FIG. 7 shows the internal configuration of the display-panel section 120 and the data-line driving circuit 140. As shown in FIG. 7, the display-panel section 120 has the pixel circuit 200 as a unit circuit at a position corresponding to the intersection of M data lines Xm (m=1 to M; m is an integer) extending in the column direction and N scanning lines Yn (n=1 to N; n is an integer) extending in the row direction. That is, each pixel circuit 200 is connected to the data line Xm extending in the column direction and the data line Yn extending in the row direction and is thereby arranged in matrix, forming an electronic circuit.

Furthermore, a first power line L1 and a second power line L2 are provided for each row along the row direction (the direction in which the scanning line extends).

The pixel circuit 200 includes an organic EL element 210 similar to the driven element L of the first embodiment. The pixel circuit 200 for one row is connected to the first power line L1 and the second power line L2 corresponding to the particular row. That is, the pixel circuit 200 for one row commonly uses the first power line L1 and the second power line L2.

Here, the first power line L1 in each row is indirectly connected to a voltage-supply line VL via a transistor Q, and the second power line L2 in each row is directly connected to the voltage-supply line VL, so that a driving voltage Vdd is supplied to the pixel circuit 200.

The scanning-line driving circuit 130 selects a scanning line one by one in sequence among a plurality of scanning lines Yn in accordance with a scanning control signal output from the signal generation circuit 110, and supplies a scanning signal indicating the selection to the selected scanning line.

The data-line driving circuit 140 includes a line driver 230 for each of the data lines, and one line driver 230 is connected to one end of the data line corresponding thereto. Here, the line driver 230 generates data current Idata and supplies the current to the corresponding data line in accordance with a data control signal output from the signal generation circuit 110.

Generally, when the scanning line Yn of the n-th row is selected, the line driver 230 of the m-th column supplies, to the data line Xm of the m-th column, the data current Idata indicating the luminance of the organic EL element 210 contained in the pixel circuit 200 positioned in the n-th row and in the m-th column.

In the pixel circuit 200, as is described below, when the internal state is set according to the data current Idata supplied to the corresponding data line, the electrical current Ids supplied to the organic EL element 210 is controlled according to the internal state.

The power-line control circuit 150 supplies a power-line control signal to a power-line control line F provided for each row in order to control the on/off state of the transistor Q of each row. More specifically, the power-line control circuit 150 generates a power-line control signal of a particular row in such a manner as to completely match a scanning signal indicating the selection of the scanning line of the row concerned or generates the signal in such a manner that the selected state overlaps partly with respect to time and supplies the signal to the power-line control line F corresponding to the row concerned.

FIG. 8 is a circuit diagram showing a detailed configuration of the pixel circuit 200 as a unit circuit according to the second embodiment. In FIG. 8, a pixel circuit among the pixel circuits 200, corresponding to the intersection of the scanning line Yn of the n-th row and the data line Xm of the m-th column, is shown as an example.

As shown in FIG. 8, the pixel circuit 200 includes three transistors and one capacitor element. More specifically, the pixel circuit 200 includes a driving transistor Trd, a compensating transistor Trc, a switching transistor Trs, and a holding capacitor C1 as a capacitor element.

In this embodiment, the conduction types of the driving transistor Trd and the compensating transistor Trc are p types (p channel), and the conduction type of the switching transistor Trs is n type (n channel). However, the selection of these conduction types is not limited to that shown here. Furthermore, the transistor contained in the pixel circuit 200 is usually formed by a TFT (Thin-Film Transistor).

The drain (first terminal) of the driving transistor Trd is connected to the anode of the organic EL element 210. The cathode of the organic EL element 210 is grounded. The source (second terminal) of the driving transistor Trd is connected to the second power line L2. The second power line L2 is connected to the voltage-supply line VL provided on the right end of the display-panel section 120. The gate (first gate) of the driving transistor Trd is connected to a node N. The node N is a connection point among the gate of the driving transistor Trd, one end of the holding capacitor C1, the drain of the switching transistor Trs, and the drain of the compensating transistor Trc. The other end of the holding capacitor C1 is connected to the source of the driving transistor Trd, that is, the second power line L2.

The drain (sixth terminal) of the switching transistor Trs is connected to the data line Xm, and the drain (fifth terminal) thereof is connected to the node N. Furthermore, the gate of the switching transistor Trs is connected to the scanning line Yn. Therefore, when a scanning signal indicating that the scanning line Yn is selected is supplied to the scanning line Yn (a high level is reached), the switching transistor Trs enters a conduction state.

Not only is the drain (third terminal) of the compensating transistor Trc connected to the node N, but so is the gate. Furthermore, the source (fourth terminal) of the compensating transistor Trc is connected to the first power line L1. Therefore, the compensating transistor Trc functions as a diode in which the portion from the first power line L1 to the node N is in the forward direction.

The transistor formed in an arranged manner within the pixel circuit 200 is usually formed by a TFT (Thin-Film Transistor).

The first power line L1 is connected to the voltage-supply line VL via a transistor Q as a control circuit. The first power line L1 and the second power line L2 form a power line L.

The gate of the transistor Q is connected to the power-line control line F. The transistor Q assumes one of an electrically disconnected state (off state) or an electrically connected state (on state) in accordance with a power-line control signal supplied via the power-line control line F from the power-line control circuit 150. Since the conduction type of the transistor Q is p type (p channel), the transistor Q becomes on when the power-line control signal reaches a low level.

Next, referring to FIG. 9, a description is provided of a method of driving the pixel circuit 200 in the organic EL display 100. FIG. 9 is a timing chart illustrating this driving method.

First, in a data writing period Trp, when a scanning signal indicating the selection of the scanning line Yn is supplied by the scanning-line driving circuit 130 (when the scanning line Yn reaches a high level), the switching transistor Trs is turned on. Since a low-level power-line control signal to turn on the transistor Q is supplied to the power-line control line F in response to such a supply of the scanning signal, the transistor Q is also turned on in the data writing period Trp.

Therefore, the electrical current flows through the path of the voltage-supply line VL, the transistor Q, the first power line L1, the compensating transistor Trc, the switching transistor Trs, and the data line Xm. The electrical current which flows at this time is data current Idata generated by the line driver 230, that is, data current Idata indicating the luminance of the organic EL element 210 contained in the pixel circuit 200 of the n-th row and the m-th column.

Then, a voltage VC1 corresponding to the data current Idata which flows at this time is generated in the node N, this voltage is held in the holding capacitor C1, and this voltage is applied to the gate of the driving transistor Trd. As a result, the electrical current Ids flows through the driving transistor Trd, and the organic EL element 210 begins to emit light.

Next, when the data writing period Trp ends and the light-emitting period Tel starts, the scanning line Yn reaches a low level. As a result, the switching transistor Trs becomes off. Since the power-line control signal changes to a high level in response to such a state transition of the scanning signal, the transistor Q also becomes off. Even if both the switching transistor Trs and the transistor Q become off, the voltage VC1 held by the holding capacitor C1 is applied to the gate of the driving transistor Trd. Therefore, the light-emitting state of the organic EL element 210 is maintained until the scanning line Yn is selected again (until the transistor Q becomes on again).

Such an operation is also performed at the same time in each of the pixel circuits 200 for one row corresponding to the scanning line Yn. Furthermore, when viewed with respect to the entire pixel circuit 200, the operation is performed in sequence for the scanning lines of the first, second, third, . . . , N-th rows.

Furthermore, the data writing period Trp and the light-emitting period Tel form a driving period Tc. This driving period Tc means a period in which the luminance of the organic EL element 210 is updated once, and is synonymous with a so-called frame period (vertical scanning period).

In order to briefly describe the operation of the pixel circuit, if a threshold voltage Vth2 of the compensating transistor Trc is considered and represented, an electrical potential Vn in the node N is represented by a value such that the voltage VC1 generated in the holding capacitor C1 and a value obtained by subtracting the threshold voltage Vth2 of the compensating transistor Trc from the driving voltage Vdd (Vn=Vdd−Vth2) are added together, that is, is expressed by the following equation (1), $$Vg=VC1+Vdd-Vth2 \quad (1)$$

Since the voltage Vgs between the gate and the source of the driving transistor Trd is a difference (Vg−Vs) between the gate electrical potential Vg and the source electrical potential Vs (=Vdd) of the driving transistor Trd, the voltage Vgs between the gate and the source of the driving transistor can be modified as shown in the following equation (2).

$$Vgs=Vg-Vs \quad (2)$$

When Vg and Vs (=Vdd) shown in equation (1) are substituted in equation (2), the following equation (3) can be obtained.

$$Vgs=VC1+Vdd-Vth2-Vdd=VC1-Vth2 \quad (3)$$

Here, in the manner described above, if it is assumed that the threshold voltage Vth2 of the compensating transistor Trc is approximately equal to the threshold voltage Vth1 of the driving transistor Trd, the voltage Vgs between the gate and the source shown in equation (3) can be expressed by the following equation (4).

$$Vgs=VC1-Vth1 \quad (4)$$

On the other hand, the electrical current Ids flowing between the source and the drain of the driving transistor Trd is expressed by the following equation (5).

$$Ids=(\frac{1}{2})b(-Vgs-Vth1)2 \quad (5)$$

b in this equation is a gain coefficient, and is shown as
b=(mAW/L)
where m is the carrier mobility, A is the gate capacity, W is the channel width, and L is the channel length.

When Vgs shown in equation (4) is substituted in equation (5), $$Ids=(\frac{1}{2})b(-VC1+Vth1-Vth1)2=(\frac{1}{2})b(-VC1)2 \quad (6)$$

As can also be seen from equation (6), the electrical current Ids flowing between the source and the drain of the driving transistor Trd is determined only by the voltage VC1 generated in the holding capacitor C1.

Generally, it is easy to make the threshold-value characteristics of transistors in proximity to each other uniform. For this reason, since it is also easy to make uniform the threshold voltage characteristics of the compensating transistor Trc and the driving transistor Trd which are very close to each other, such as in the same pixel circuit, the electrical current Ids flowing through the organic EL element 210 can be determined by the data current Idata without depending on the threshold voltage characteristic of the driving transistor Trd.

That is, also in the second embodiment, since the drain of the compensating transistor Trc is directly connected to the gate of the driving transistor Trd, these are in proximity to each other. As a result, it is easy to make the characteristics of the two transistors uniform, and the data current Idata passing through the compensating transistor Trc is directly reflected in the electrical current Ids controlled by the driving transistor Trd, making it possible to enhance the matching.

Therefore, even if, due to variations, the threshold voltage of the driving transistor Trd differs for each pixel circuit 200 in the display-panel section 120, no influence is exerted on the electrical current Ids flowing through the organic EL element 210, and thus, reducing or suppressing the luminance variations due to variations in the characteristics of the driving transistor becomes possible in the same manner as in the first embodiment.

In addition, in the second embodiment, the number of transistors formed in one pixel circuit 200 is three, and when compared to the four transistors of the pixel circuit 20 of the first embodiment, the number of transistors can be reduced by one. For this reason, according to the second embodiment, in addition to being capable of suppressing luminance variations due to variations in the characteristics of the driving transistor, a decrease in the yield due to defects of transistors can be reduced, the aperture area per pixel can be ensured, and the aperture ratio can be enhanced.

Also, in the second embodiment, settings may be performed as appropriate in the same manner as in the first embodiment. For example, the gain coefficient of the compensating transistor Trc may be greater than the gain coefficient of the driving transistor Trd. According to such a configuration, since the data current Idata flowing through the compensating transistor Trc becomes larger than the electrical current Ids flowing through the driving transistor Trd, the time required to store electrical charge in the capacitor element C can be shortened. As a result, it becomes possible to cope with a higher frequency of the scanning frequency required as the number of pixels of the display panel is increased and the size thereof is increased.

Contrary to this, the gain coefficient of the compensating transistor Trc may be smaller than the gain coefficient of the driving transistor Trd. According to this configuration, since the data current Idata by the compensating transistor Trc becomes smaller than the electrical current Ids by the driving transistor Trd, the power consumed during the storage of the electrical charge into the capacitor element C can be reduced.

In the second embodiment, both the switching transistor Trs and the transistor Q are preferably set so that these are turned on in the data writing period Trp and are turned off in the light-emitting period Tel, but the setting is not particularly limited to this. Furthermore, the driving current Ids is preferably set so that the current does not flow to the organic EL element 210 in the data writing period Trp and flows in the light-emitting period Tel, but the setting is not particularly limited to this.

By increasing the channel width of the compensating transistor Trc with respect to the driving transistor Trd, a relatively high electrical current can be used as data current Idata also when low-gradation data is supplied in comparison with a case in which the sizes of the driving transistor Trd and the compensating transistor Trc are equal. Therefore, an operation delay due to parasitic capacitance, etc., can be reduced or suppressed.

Furthermore, in the pixel circuit 200, the threshold voltage Vth1 of the driving transistor Trd is preferably set so as to be equal to or greater than the threshold voltage Vth2 of the compensating transistor Trc, but the threshold voltage Vth1 is not particularly limited to this. For example, when the organic EL element 210 is made to emit light also in the data writing period Trp, the threshold voltage Vth1 of the driving transistor Trd may be set so as to be lower than the threshold voltage Vth2 of the compensating transistor Trc.

In addition, the period in which a power-line control signal is supplied and the period in which a scanning signal is supplied are set in such a manner that these periods overlap completely or partly with respect to time. That is, the transistor Q is set so as to be turned on in substantially the same period as the data writing period Trp. However, by supplying a power-line control signal for turning on the transistor Q earlier than a scanning signal indicating the selection of a scanning line, it is possible to reduce or prevent the voltage of the gate of the driving transistor Trd set by the data current Idata, from changing by the driving voltage Vdd. This may be desirable.

In FIG. 7, although a voltage-supply line VL is provided on the right end of the display panel 120, its position is not limited to this, and, for example, the voltage-supply line VL may be provided on the left end. Furthermore, although the transistor Q and the voltage-supply line VL are formed as members separate from the power-line control circuit 150, the transistor Q and the voltage-supply line VL may be provided inside the power-line control circuit 150.

In addition, although the transistor Q is used as a control circuit, a switch capable of switching between a low electrical potential and a high electrical potential may be provided in place of the transistor Q. In order to enhance the driving performance of the driving transistor Trd, a buffer circuit and a voltage follower circuit including a source follower circuit may be used to sufficiently lower the impedance of the second power line L2 and the voltage-supply line VL.

Application of Second Embodiment

In the display panel shown in FIG. 7, a description is provided by using an example in which gradation display using a single color is made for the sake of simplicity of description. However, when functioning as an actual display panel is considered, there are cases in which it is necessary to make a color display. Accordingly, an electro-optic apparatus for color display is described as an application example of the second embodiment.

FIG. 10 is a schematic showing a configuration of an electro-optic apparatus according to this application example. The electro-optic apparatus in FIG. 10 is an organic EL display using organic EL elements as electro-optic elements. Component members which are the same as those in FIG. 7 are given the same reference numerals, and detailed descriptions thereof are omitted.

In FIG. 10, the display-panel section 120 includes a red pixel circuit 200R having an organic EL element 210 which emits red light, a green pixel circuit 200G having an organic EL element 210 which emits green light, and a blue pixel circuit 200B having an organic EL element 210 which emits blue light.

In the display-panel section 120, the red pixel circuit 200R is arranged in the first row, the green pixel circuit 200G is arranged in the second row, the blue pixel circuit 200B is arranged in the third row, and the red pixel circuit 200R is arranged in the fourth row. Hereafter, this arrangement is repeated. That is, the pixel circuit for the same color is arranged for one row along the extension direction of the scanning line, and the pixel circuit for the same color for one row commonly uses the scanning line, both the first power line L1 and the second power line L2.

The circuit configuration of the pixel circuits 200R, 200G, and 200B for each color is the same as the circuit configuration of the pixel circuit 200 shown in FIG. 8.

In this application example, three power-supply lines are provided to supply a dedicated driving voltage for each color. That is, the power-supply line VLR supplies a driving voltage VddR for the red pixel circuit 200R, a power-supply line VLG supplies a driving voltage VddG for the green pixel circuit 200G, and a power-supply line VLB supplies a driving voltage VddB for the blue pixel circuit 200B.

Furthermore, the first power line L1 and the second power line L2 are provided for each row along the row direction. Here, the first power line L1 corresponding to the red pixel circuit 200R positioned in the same row is indirectly connected to the power-supply line VLR via a transistor QR, and supplies the driving voltage VddR when the transistor QR are turned on, whereas the second power line L2 is directly connected to the power-supply line VLR and always supplies the driving voltage VddR.

The same as the above also applies to the green pixel circuit 200G and the blue pixel circuit 200B positioned in the same row. That is, the first power line L1 for the green pixel circuit 200G positioned in the same row supplies the driving voltage VddG when a transistor QG is turned on, whereas the second power line L2 always supplies the driving voltage VddG. Furthermore, the first power line L1 for the blue pixel circuit 200B positioned in the same row supplies the driving voltage VddB when a transistor QB is turned on, whereas the second power line L2 always supplies the driving voltage VddB.

Next, a description is provided of a method of driving the pixel circuits 200R, 200G, 200B in the electro-optic apparatus according to the application example.

First, when the scanning line Y1 of the first row is selected and a scanning signal indicating that fact is supplied (when the scanning line Y1 reaches a high level), the switching transistor Trs is turned on in each of the red pixel circuits 200R positioned in the first row. Since the power-line control signal of the first row reaches a low level in response to such a supply of the scanning signal, the transistor QR of the first row is also turned on.

Furthermore, in response to the supply of the scanning signal, the data current Idata indicating the luminance of the organic EL element 210 contained in the pixel circuit 200R of the first row is supplied to each data line of each column.

As a result, in each of the pixel circuits 200R of the first row, the electrical charge corresponding to the data current Idata is stored in the holding capacitor C1, thereby holding the gate voltage of the driving transistor Trd. Consequently, the driving transistor Trd begins to supply the driving current Ids corresponding to the gate voltage to the red organic EL element 210, and as a result, the red organic EL element 210 begins to emit light.

Then, when a scanning line Y2 of the second row is selected and a scanning signal indicating that fact is supplied (when the scanning line Y2 reaches a high level), the switching transistor Trs is turned on in each of the green pixel circuits 200G positioned in the second row. Since the power-line control signal of the second row reaches a low level in response to such a supply of the scanning signal, the transistor QB of the second row is also turned on.

In response to the supply of the scanning signal, the data current Idata indicating the luminance of the organic EL element 210 contained in the pixel circuit 200G of the second row is supplied to each data line of each column.

As a result, in each of the pixel circuits 200G of the second row, the electrical charge corresponding to the data current Idata is stored in the holding capacitor C1, thereby holding the gate voltage of the driving transistor Trd. Consequently, the driving transistor Trd begins to supply the driving current Ids corresponding to the gate voltage to the green organic EL element 210, and as a result, the green organic EL element 210 begins to emit light.

When the scanning line Y2 of the second row is selected, in each of the pixel circuits 200R of the first row, both the switching transistor Trs and the transistor QR are turned off. However, since the driving transistor Trd supplies the driving current Ids corresponding to the gate voltage held by the holding capacitor C1 to the red organic EL element 210, the light-emitting state of the red organic EL element 210 is maintained.

Next, when a scanning line Y3 of the third row is selected and a scanning signal indicating that fact is supplied (when the scanning line Y3 reaches a high level), the switching transistor Trs is turned on in each of the blue pixel circuits 200B positioned in the third row. Since the power-line control signal of the third row reaches a low level in response to such a supply of the scanning signal, the transistor QB of the third row is also turned on.

In response to the supply of the scanning signal, the data current Idata indicating the luminance of the organic EL element 210 contained in the pixel circuit 200B of the third row is supplied to each data line of each column.

As a result, in each of the pixel circuits 200B of the third row, the electrical charge corresponding to the data current Idata is stored in the holding capacitor C1, thereby holding the gate voltage of the driving transistor Trd. Consequently, the driving transistor Trd begins to supply the driving current Ids corresponding to the gate voltage to the blue organic EL element 210, and as a result, the blue organic EL element 210 begins to emit light.

When the scanning line Y3 of the third row is selected, in each of the pixel circuits 200G of the second row, both the switching transistor Trs and the transistor QR are turned off. However, since the driving transistor Trd supplies the driving current Ids corresponding to the gate voltage held by the holding capacitor C1 to the green organic EL element 210, the light-emitting state of the green organic EL element 210 is maintained.

Hereafter, when the same operation is repeated in sequence up to the fourth, fifth, sixth, . . . , N-th rows, the scanning line Y1 of the first row is selected again, and data (electrical charge corresponding to the data current Idata stored in the holding capacitor C1) is rewritten.

As described above, also, in the organic EL display 100 according to the application example, the same advantages as those of the second embodiment can be obtained.

In general, since the light-emission efficiency of the red, green, and blue organic EL elements 210 differ from each other, also, for the driving voltage, it may be necessary to set an optimum value for each color. In the application example, since the configuration is formed in such a manner that pixel circuits for the same color are arranged in the same row, and the first power line L1 and the second power line L2 are commonly used to supply a driving voltage for each color, it is easy to set an optimum driving voltage for each color. Furthermore, there are cases in which the organic EL element 210 deteriorates over time due to a light emission for a long period of time, and a need exists to reset the driving voltage for each color. In the application example, also, such a resetting of the driving voltage for each color becomes easy.

In the above-described first and second embodiments and the application example thereof, a pixel circuit is described as a unit circuit (electronic circuit) by way of example, and a storage device, such as a RAM (in particular, an MRAM), may be used. Furthermore, an organic EL element is used as a driven element by way of example, but an inorganic EL element may be used, and an LED and an FED may also be used. In addition, a sensor element such as an optical detection element may be used.

Electronic Equipment

Next, a description is provided of several examples of electronic equipment in which an electro-optic apparatus including a unit circuit according to the first and second embodiments and the application example thereof is used.

FIG. 11 is a perspective view showing a configuration of a mobile personal computer in which this electro-optic apparatus is used. As shown in FIG. 11, an electro-optic apparatus 300 including a unit circuit according to the embodiments is also used as a display unit of a personal computer 2100. A main unit 2104 of the personal computer 2100 is provided with a keyboard 2102.

FIG. 12 is a perspective view showing a configuration of a portable phone in which the electro-optic apparatus 300 is used. In FIG. 12, a portable phone 2200 includes a plurality of operation buttons 2202 and furthermore an earpiece 2204, a mouthpiece 2206, and the electro-optic apparatus 300.

FIG. 13 is a perspective view showing a configuration of a digital still camera in which the electro-optic apparatus 300 is used in a finder. A silver-halide camera exposes a film by an optical image of a subject, whereas a digital still camera 2300 causes image capturing elements, such as CCDs (Charge Coupled Devices), to photoelectrically convert an optical image of a subject in order to generate and store an image-captured signal. Here, on the rear of a main unit 2302 in the digital still camera 2300, the electro-optic apparatus 300 is provided. Since the electro-optic apparatus 300 performs a display in accordance with an image-captured signal, the apparatus functions as a finder to display a subject. Furthermore, on the front side (the rear side in FIG. 13) of the main unit 2302, a light-receiving unit 2304 including optical lenses and CCDs is provided.

When a photographer confirms a subject image displayed on the electro-optic apparatus 300 and depresses a shutter button 2306, an image-captured signal of the CCDs at that time is transferred and stored into the memory of a circuit substrate 2308.

Furthermore, in this digital still camera 2300, the side surface of a case 2302 is provided with video signal output connectors 2312 to make an external display and a data communication input/output terminal 2314.

In addition to the personal computer shown in FIG. 11, the portable phone shown in FIG. 12, and the digital still camera shown in FIG. 13, examples of various other electronic equipment in which the electro-optic apparatus can be used include: a liquid-crystal television, a viewfinder-type/monitor-direct-view-type video tape recorder, a car navigation apparatus, a pager, an electronic notebook, an electronic calculator, a word processor, a work station, a television phone, a POS terminal, and a device having a touch panel, for example. It is a matter of course that the electro-optical apparatus according to the embodiments can be used as a display section of these and other various pieces of electronic equipment.

Advantages

As has thus been described, according to the present invention, it becomes possible to supply target electrical current to a current-type driven element, such as an organic EL element, while the influence of variations in the driving transistor is reduced.

What is claimed is:

1. A unit circuit, comprising:
   a driven element;
   a driving transistor to control an amount of electrical current to said driven element;
   a capacitor element connected to a gate of said driving transistor; and
   a diode-connected compensating transistor directly connected to said gate, a conducting state of said driving transistor being set according to a data current, supplied as a data signal, which passes through said compensating transistor.

2. The unit circuit according to claim 1, further comprising:
   a first switching transistor connected in series with said compensating transistor via one of a source and a drain thereof,
   the other of the source and the drain of said first switching transistor being connected to a signal line, and when said signal line and said compensating transistor are electrically connected to each other via said first switching transistor, said data current passing through said compensating transistor.

3. The unit circuit according to claim 1, in said driving transistor and said compensating transistor, electrical-current characteristics between the source and the drain with respect to the gate voltage being substantially the same.

4. The unit circuit according to claim 1, an amount of electrical current which flows through said compensating transistor being larger than an amount of electrical current controlled by said driving transistor.

5. The unit circuit according to claim 1, said driven element being an organic electroluminescent element.

6. The unit circuit according to claim 1, said driving transistor being a p-channel type.

7. An electronic apparatus, comprising:
   the unit circuit according to claim 1.

8. Electronic equipment, comprising:
   an electro-optic apparatus that includes the unit circuit according to claim 1 that is used as a pixel circuit.

9. A unit circuit, comprising:
   a driven element;
   a driving transistor to control an amount of electrical current to said driven element;
   a capacitor element connected to a gate of said driving transistor;
   a first switching transistor connected to the gate of said driving transistor;
   a first signal line connected to a gate of said first switching transistor;
   a second signal line connected to one of a source and a drain of said first switching transistor;
   a third signal line that is different from the first signal line;
   a power line to which a power-supply voltage is applied; and
   a compensating transistor and a second switching transistor, connected in series with each other, and provided between said power line and the other of the source and the drain of said first switching transistor, said compensating transistor being diode-connected, and a gate of said second switching transistor being connected to the third signal line.

10. The unit circuit according to claim 9,
    a period in which both said first switching transistor and said second switching transistor are turned on being provided.

11. The unit circuit according to claim 9,
    said second signal line supplying an electrical current as a data signal.

12. The unit circuit according to claim 11,
    electrical charge corresponding to an amount of electrical current which flows through said compensating transistor being stored in said capacitor element.

13. The unit circuit according to claim 9, said driving transistor, said first and second switching transistors, and said compensating transistor being Thin-Film Transistors.

14. A unit circuit, comprising:
    a driven element;
    a driving transistor to control an amount of electrical current to said driven element;
    a capacitor element connected to a gate of said driving transistor;
    a first switching transistor connected to the gate of said driving transistor;
    a first signal line connected to the gate of said first switching transistor;
    a second signal line connected to one of a source and a drain of said first switching transistor;
    a power line to which a power-supply voltage is applied; and
    a compensating transistor and a second switching transistor, connected in series with each other, and provided between said power line and the other of the source and the drain of said first switching transistor, said compensating transistor being diode-connected, and a gate of said second switching transistor being connected to said first signal line.

15. A unit circuit, comprising:
    a first scanning line;
    a data line;
    a second scanning line that is different from the first scanning line;
    a power line;
    a first switching transistor which is turned on or off in accordance with a scanning signal supplied to the first scanning line, one of a source and a drain thereof being connected to the data line;
    a compensating transistor which functions as a diode;
    a second switching transistor which is turned on or off in accordance with a scanning signal supplied to the second scanning line, the compensating transistor and the second switching transistor being connected in series with each other between the power line to which a power-supply voltage is applied and the other of the source and the drain of said first switching transistor;
    a driving transistor, having a gate connected to the other of the source and the drain of said first switching transistor, to drive the driven element; and a capacitor element to hold a gate voltage of the driving transistor.

16. A unit circuit, comprising:

a first scanning line;

a data line;

a power line;

a first switching transistor which is turned on or off in accordance with a scanning signal supplied to the first scanning line, one of a source and a drain thereof being connected to the data line;

a compensating transistor which functions as a diode;

a second switching transistor which is turned on or off in accordance with a scanning signal supplied to said first scanning line, the compensating transistor and the second switching transistor being connected in series with each other between the power line to which a power-supply voltage is applied and the other of the source and the drain of said first switching transistor;

a driving transistor, having a gate connected to the other of the source and the drain of said first switching transistor, to drive the driven element; and a capacitor element to hold the gate voltage of said driving transistor.

17. A unit circuit, comprising:

a scanning line;

a data line;

a first power line;

a second power line;

a switching transistor which is turned on or off in accordance with a scanning signal supplied to the scanning line, one of a source and a drain thereof being connected to the data line;

a compensating transistor, which functions as a diode, between the first power line to which a first power-supply voltage is applied during at least a part or the whole of a period in which said switching transistor is turned on and the other of the source and the drain of said switching transistor;

a driving transistor, having a gate connected to the other of the source and the drain of said switching transistor, one of the source and the drain thereof being connected to the second power line to which a second power-supply voltage is applied, to drive the driven element; and a capacitor element to hold a gate voltage of said driving transistor.

18. The unit circuit according to claim 17, said first power-supply voltage and said second power-supply voltage being substantially equal.

19. A unit circuit, comprising:

a scanning line;

a data line;

a first power line;

a second power line;

a switching transistor having a gate connected to the scanning line to which a scanning signal is supplied, one of a source and a drain thereof being connected to the data line;

a compensating transistor having a gate connected to a source or a drain thereof, one of the source and the drain being connected to the first power line to which a first power-supply voltage is applied during at least a part or the whole of a period in which said switching transistor is turned on in accordance with said scanning signal, and the other of the source and the drain of said compensating transistor being connected to the other of the source and the drain of said switching transistor;

a driving transistor, having a gate connected to the other of the source and the drain of said switching transistor, one of the source and the drain of said driving transistor being connected to the second power line to which a second power-supply voltage is applied, to drive the driven element; and a capacitor element having one end connected to the gate of said driving transistor.

* * * * *